(12) United States Patent
Batres et al.

(10) Patent No.: US 11,908,974 B2
(45) Date of Patent: Feb. 20, 2024

(54) LIGHT EMITTING DIODES CONTAINING DEACTIVATED REGIONS AND METHODS OF MAKING THE SAME

(71) Applicant: NANOSYS, INC., Milpitas, CA (US)

(72) Inventors: Max Batres, Fremont, CA (US); Fariba Danesh, Los Altos Hills, CA (US); Michael J. Cich, Fremont, CA (US); Zhen Chen, Dublin, CA (US)

(73) Assignee: GLO TECHNOLOGIES LLC, New York, NY (US)

( * ) Notice: Subject to any disclaimer, the term of this patent is extended or adjusted under 35 U.S.C. 154(b) by 93 days.

(21) Appl. No.: 17/583,867

(22) Filed: Jan. 25, 2022

(65) Prior Publication Data

US 2022/0149240 A1    May 12, 2022

Related U.S. Application Data

(62) Division of application No. 16/684,882, filed on Nov. 15, 2019, now Pat. No. 11,264,539.

(Continued)

(51) Int. Cl.
*H01L 33/32* (2010.01)
*H01L 33/00* (2010.01)
(Continued)

(52) U.S. Cl.
CPC ........ *H01L 33/325* (2013.01); *H01L 25/0753* (2013.01); *H01L 33/0075* (2013.01); *H01L 33/46* (2013.01)

(58) Field of Classification Search
CPC ... H01L 33/325; H01L 33/0075; H01L 33/46; H01L 25/0753; H01L 33/145;
(Continued)

(56) References Cited

U.S. PATENT DOCUMENTS

| 7,872,272 B2 | 1/2011 | Bour et al. |
| 8,669,574 B2 | 3/2014 | Konsek et al. |

(Continued)

FOREIGN PATENT DOCUMENTS

| KR | 101011063 B1 | 1/2011 |
| KR | 1020130044909 | 5/2013 |

OTHER PUBLICATIONS

International Search Report and Written Opinion, International Application No. PCT/US2019/061833, dated Mar. 9, 2020, 12 pages.

(Continued)

*Primary Examiner* — Shahed Ahmed
*Assistant Examiner* — Vicki B. Booker
(74) *Attorney, Agent, or Firm* — THE MARBURY LAW GROUP PLLC

(57) ABSTRACT

A light emitting device (LED) includes an n-doped semiconductor material layer, an active region including an optically active compound semiconductor layer stack configured to emit light located on the n-doped semiconductor material layer, a p-doped semiconductor material layer located on the active region, an anode contact contacting the p-doped semiconductor material layer, a reflector overlying and electrically connected to the anode contact, and a device-side bonding pad layer located on the reflector. The p-doped semiconductor material layer includes an electrically active region that is at least partially covered by the anode contact and an inactive region that an electrical conductivity less than 30% of the electrically active region.

4 Claims, 35 Drawing Sheets

Related U.S. Application Data

(60) Provisional application No. 62/774,395, filed on Dec. 3, 2018.

(51) Int. Cl.
  *H01L 33/46* (2010.01)
  *H01L 25/075* (2006.01)

(58) Field of Classification Search
  CPC ..... H01L 33/405; H01L 33/025; H01L 33/08; H01L 33/32; H01L 33/0008; H01L 33/005; H01L 33/14; H01L 33/36; H01L 33/60
  See application file for complete search history.

(56) References Cited

U.S. PATENT DOCUMENTS

| | | |
|---|---|---|
| 9,281,442 B2 | 3/2016 | Romano et al. |
| 9,419,183 B2 | 8/2016 | Lowgren et al. |
| 9,444,007 B2 | 9/2016 | Kryliouk et al. |
| 10,923,630 B1* | 2/2021 | Pynn ............... H01L 33/16 |
| 2006/0002442 A1* | 1/2006 | Haberern ............ H01L 33/145 |
| | | 372/44.01 |
| 2011/0133175 A1 | 6/2011 | Ryu et al. |
| 2011/0248298 A1 | 10/2011 | Park |
| 2011/0254034 A1 | 10/2011 | Konsek et al. |
| 2012/0175628 A1 | 7/2012 | Huang et al. |
| 2014/0110738 A1 | 4/2014 | Yokobayashi et al. |
| 2015/0207028 A1 | 7/2015 | Romano et al. |
| 2015/0207033 A1 | 7/2015 | Kryliouk et al. |
| 2015/0207037 A1 | 7/2015 | Lowgren et al. |
| 2017/0047481 A1 | 2/2017 | Bonar et al. |
| 2017/0062683 A1 | 3/2017 | Chen et al. |
| 2017/0104315 A1 | 4/2017 | Yeh et al. |
| 2017/0236974 A1 | 8/2017 | Malinverni et al. |
| 2018/0040774 A1 | 2/2018 | Lee et al. |
| 2018/0114878 A1 | 4/2018 | Danesh et al. |
| 2018/0159005 A1 | 6/2018 | Pokhriyal et al. |
| 2018/0198047 A1 | 7/2018 | Danesh et al. |
| 2019/0326478 A1 | 10/2019 | Danesh et al. |
| 2019/0386173 A1* | 12/2019 | Chen ............... H01L 33/06 |
| 2020/0176634 A1 | 6/2020 | Batres et al. |

OTHER PUBLICATIONS

International Preliminary Report on Patentability and Written Opinion, International Patent Application No. PCT/US2019/061833, dated Jun. 17, 2021, 8 pages.
Korean Patent Office Communication, Notification of Preliminary Rejection for Korean Patent Application No. 10-2021-7019598, dated Dec. 9, 2022, 5 pages.
European Office Communication, Supplemental and Extended Search Report and Written Opinion of the European Patent Application No. 19894094, dated Aug. 1, 2022, 10 pages.

* cited by examiner

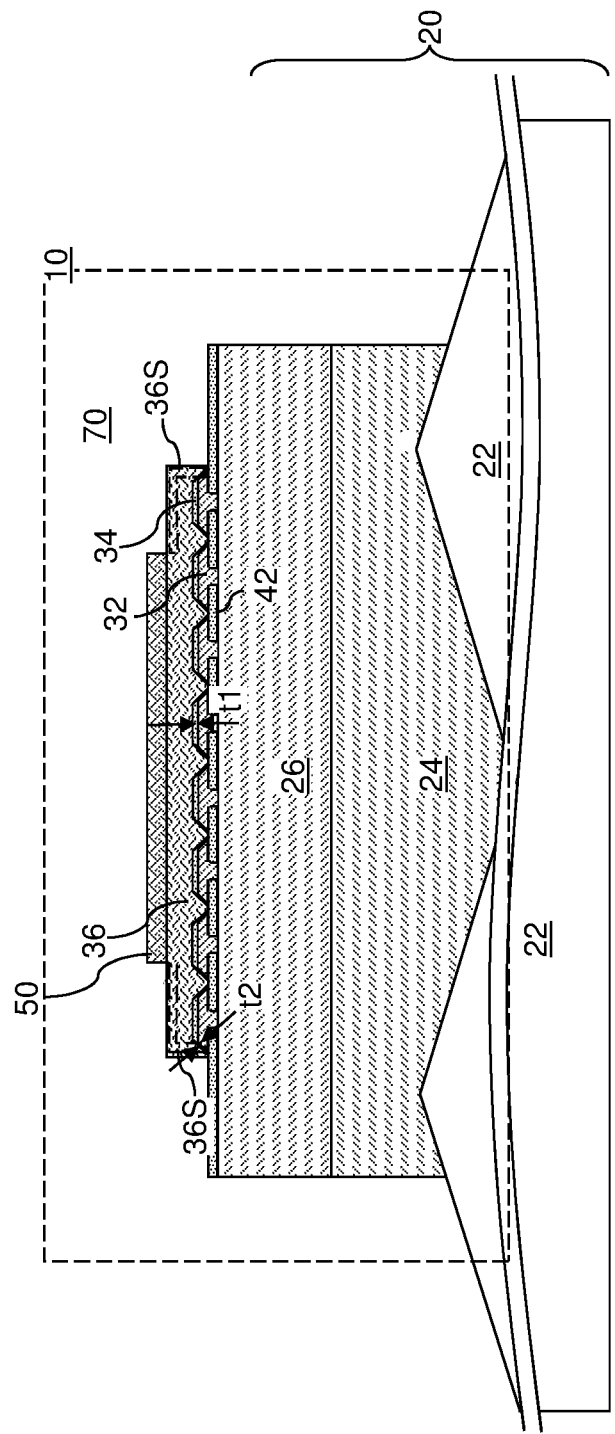

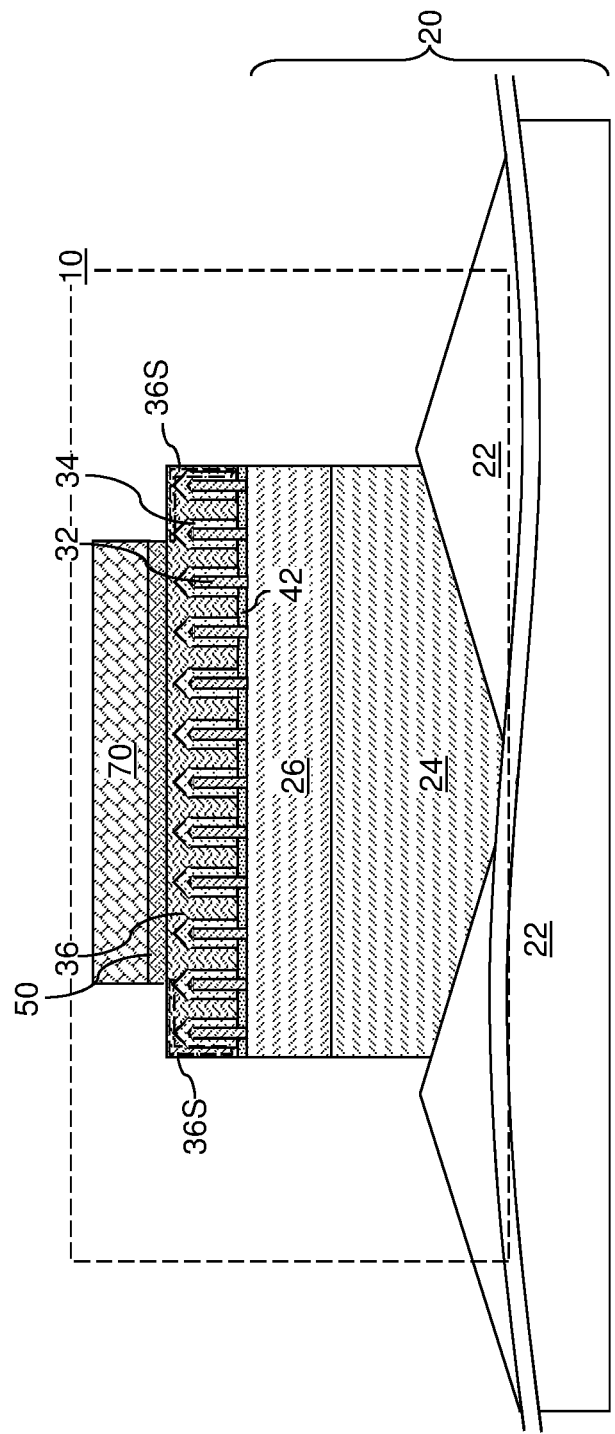

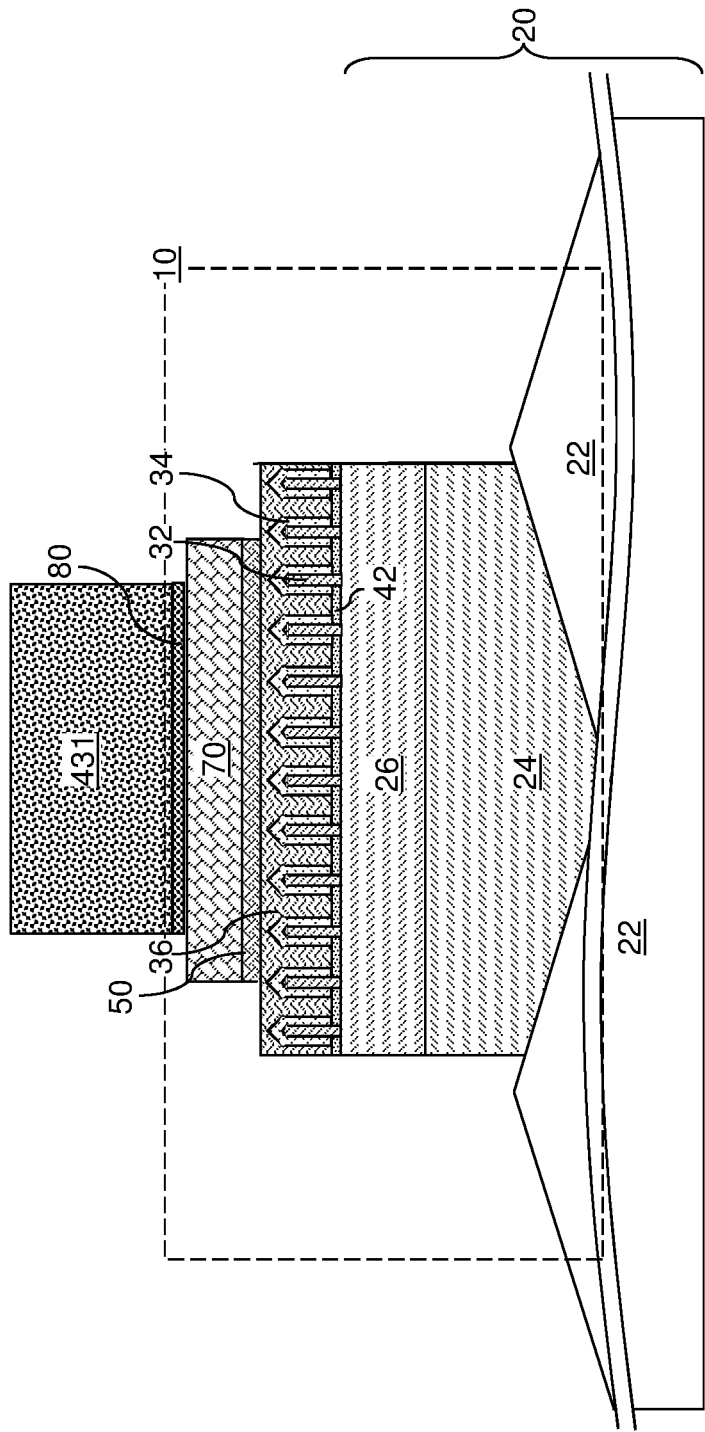

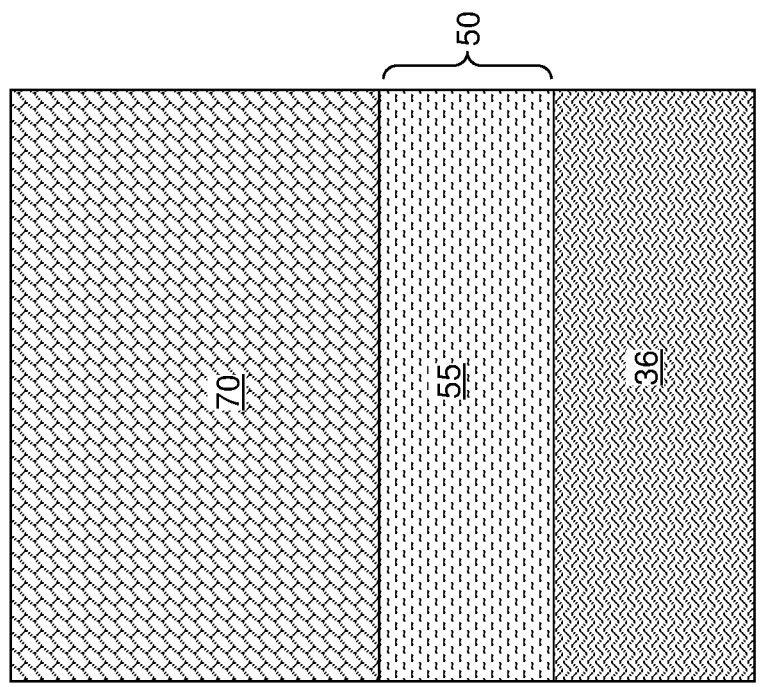
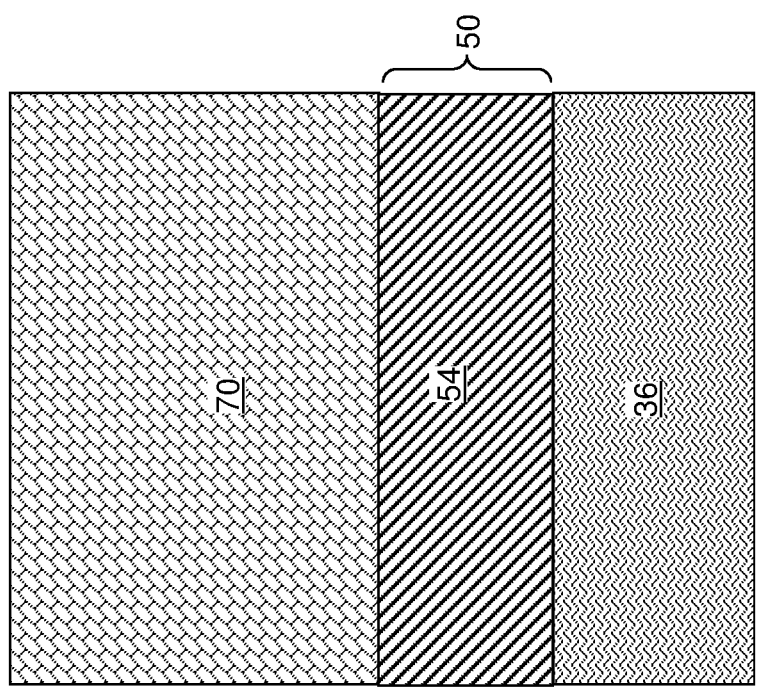
FIG. 5C
FIG. 5D

LIGHT EMITTING DIODES CONTAINING DEACTIVATED REGIONS AND METHODS OF MAKING THE SAME

RELATED APPLICATIONS

The instant application is a divisional of U.S. Non-Provisional application Ser. No. 16/684,882, filed on Nov. 15, 2019, which claims the benefit of priority of U.S. Provisional Application No. 62/774,395, filed on Dec. 3, 2018, the entire contents of which are incorporated herein by reference.

FIELD

The present invention relates to light emitting devices, and particularly to subpixel light emitting diodes with deactivated regions for direct view display devices and methods of fabricating the same

BACKGROUND

Light emitting devices such as light emitting diodes (LEDs) are used in electronic displays, such as backlights in liquid crystal displays located in laptops or televisions. Light emitting devices include light emitting diodes and various other types of electronic devices configured to emit light.

SUMMARY

According to an embodiment of the present disclosure, a light emitting device (LED) includes an n-doped semiconductor material layer, an active region including an optically active compound semiconductor layer stack configured to emit light located on the n-doped semiconductor material layer, a p-doped semiconductor material layer located on the active region, an anode contact contacting the p-doped semiconductor material layer, a reflector overlying and electrically connected to the anode contact, and a device-side bonding pad layer located on the reflector. The p-doped semiconductor material layer includes an electrically active region that is at least partially covered by the anode contact and an inactive region that an electrical conductivity less than 30% of the electrically active region.

According to another aspect of the present disclosure, a method of forming a light emitting diode (LED) comprises forming n-doped semiconductor material layer, forming an active region including an optically active compound semiconductor layer stack configured to emit light on the n-doped semiconductor material layer, forming a p-doped semiconductor material layer on the active region, deactivating a physically exposed portion of the p-doped semiconductor material layer with a plasma treatment to form an inactive region while an electrically active region remains in the p-doped semiconductor material that is not subjected to the plasma during the plasma treatment, forming an anode contact on the p-doped semiconductor material layer, forming a reflector overlying and electrically connected to the anode contact, and forming a device-side bonding pad layer on the reflector.

BRIEF DESCRIPTION OF THE DRAWINGS

FIG. 2C is a vertical cross-sectional view of a fourth configuration of a light emitting diode after formation of a reflector and performing a dopant deactivation treatment according to an embodiment of the present disclosure.

FIG. 3A is a vertical cross-sectional view of a fifth configuration of a light emitting diode after formation of a reflector and performing a dopant deactivation treatment according to an embodiment of the present disclosure.

FIG. 3B is a vertical cross-sectional view of the fifth configuration of the light emitting diode after patterning a tin portion according to an embodiment of the present disclosure.

FIG. 5C illustrates of a third configuration of an anode contact according to an embodiment of the present disclosure.

FIG. 5D illustrates of a fourth configuration of an anode contact according to an embodiment of the present disclosure.

DETAILED DESCRIPTION

Figure 1A:
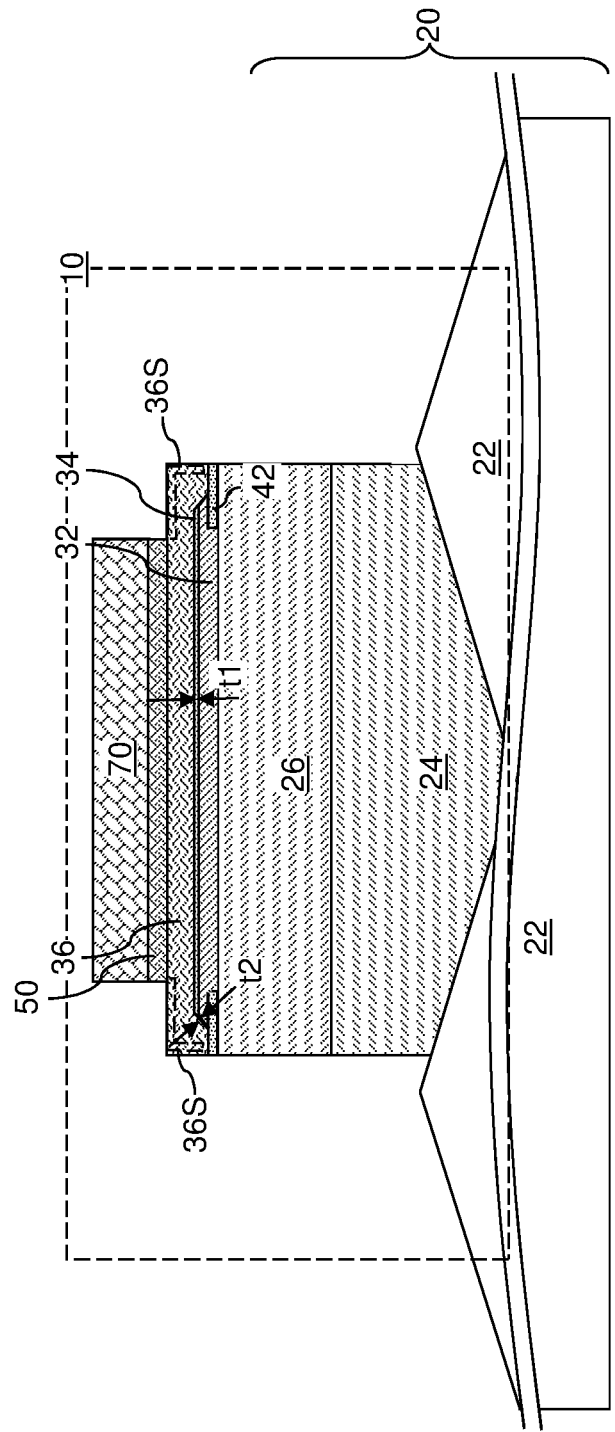
FIG. 1A is a vertical cross-sectional view of a first configuration of a light emitting diode after formation of a reflector and performing a dopant deactivation treatment according to an embodiment of the present disclosure.

A display device, such as a direct view display device, can be formed from an ordered array of pixels bonded to a backplane. Each pixel can include a set of subpixels that emit light at a respective peak wavelength. For example, a pixel can include a red subpixel, a green subpixel, and a blue subpixel. Each subpixel can include one or more light emitting diodes that emit light of a particular wavelength. Each pixel is driven by a backplane circuit such that any combination of colors within a color gamut may be shown on the display for each pixel. The display panel can be formed by a process in which LED subpixels are soldered to, or otherwise electrically attached to, a bond pad located on the backplane. The bond pad is electrically driven by the backplane circuit and other driving electronics.

FIGS. 1B, 1D, 2B, 2D, 3B, 3D, 4B, and 4D illustrate various configurations of light emitting diodes 10 of the present disclosure. FIGS. 1A, 1C, 2A, 2C, 3A, 3C, 4A, and 4C illustrate an in-process structure that is subsequently modified into the structures of FIGS. 1B, 1D, 2B, 2D, 3B, 3D, 4B, and 4D, respectively. The processing steps of FIGS. 1A, 1C, 2A, 2C, 3A, 3C, 4A, and 4C correspond to a respective processing step after performing a dopant deactivation treatment on physically exposed surfaces of a doped semiconductor material layer 36.

Referring to FIGS. 1A, 1C, 2A, 2C, 3A, 3C, 4A, and 4C, the various configurations of the light emitting devices of the present disclosure can be generally formed by providing a support substrate 22 and a single crystalline buffer semiconductor layer 24. The support substrate 22 can include a single crystalline material such as $Al_2O_3$ (sapphire) using either basal plane or r-plane growing surfaces, diamond, Si, Ge, GaN, AlN, SiC in both wurtzite ($\alpha$) and zincblende ($\beta$) forms, InN, GaP, GaAsP, GaAs, InP, ZnO, ZnS, and ZnSe. For example, the support substrate 22 can include sapphire (i.e., single crystalline aluminum oxide) with a suitable surface orientation. The support substrate 22 may comprise a patterned sapphire substrate (PSS) having a patterned (e.g., rough) growth surface. Bumps, dimples, and/or angled cuts may, or may not, be provided on the top surface of the support substrate 22 to facilitate epitaxial growth of the single crystalline compound semiconductor material of the buffer layer, to facilitate separation of the single crystalline buffer semiconductor layer 24 from the support substrate 22 in a subsequent separation process. If bumps and/or dimples are provided on the top surface of the support substrate 22, the lateral dimensions of each bump or each dimple can be in a range from 1.5 micron to 6 micron although lesser and greater lateral dimensions can also be employed. The center-to-center distance between neighboring pairs of bumps or dimples can be in a range from 3 microns to 15 microns, although lesser and greater distances can also be employed. Various geometrical configurations can be employed for arrangement of the bumps or dimples. The height of the bumps and/or the depth of the dimples may be in on the order of 1 microns to 3 microns, although lesser and greater heights and/or depths can also be employed.

The single crystalline buffer semiconductor layer 24 includes a single crystalline compound semiconductor material such as a III-V compound semiconductor material, for example a Group III-nitride compound semiconductor material. The deposition process for forming the single crystalline buffer semiconductor layer 24 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The single crystalline buffer semiconductor layer 24 can have a constant or a graded composition such that the composition of the single crystalline buffer semiconductor layer 24 at the interface with the support substrate 22 provides a substantial lattice matching with the two-dimensional lattice structure of the top surface of the support substrate 22. The composition of the single crystalline buffer semiconductor layer 24 can be gradually changed during the deposition process. If the support substrate 22 includes patterned sapphire, then the bottom surface of the single crystalline buffer semiconductor layer 24 may be a patterned (i.e., rough) surface.

The materials that can be employed for a bottom portion of the single crystalline buffer semiconductor layer 24 can be, for example, $Ga_{1-w-x}In_wAl_xN$ in which w and x range between zero and less than one, and can be zero (i.e., GaN) and are selected to match the lattice constant of the top surface of the support substrate 22. Optionally, As and/or P may also be included in the material for the bottom portion of the buffer layer, in which case the bottom portion of the single crystalline buffer semiconductor layer 24 can include $Ga_{1-w-x}In_wAl_xN_{1-x-z}As_yP_z$ in which y and z between zero and less than one, that matches the lattice constant of the top surface of the support substrate 22. The materials that can be employed for an top portion of the single crystalline buffer semiconductor layer 24 include, but are not limited to, III-V compound materials, including III-nitride materials, such as gallium nitride (GaN), aluminum nitride (AlN), indium nitride (InN), gallium aluminum nitride, and gallium indium nitride, as well as other III-V materials, such as gallium phosphide (GaP), gallium arsenide (GaAs), gallium antimonide (GaSb), Indium phosphide (InP), indium arsenide (InAs), and indium antimonide (InSb). The composition of the single crystalline buffer semiconductor layer 24 can gradually change between the bottom portion of the single crystalline buffer semiconductor layer 24 and the top portion of single crystalline buffer semiconductor layer 24 such that dislocations caused by a gradual lattice parameter change along the growth direction (vertical direction) does not propagate to the top surface of the single crystalline buffer semiconductor layer 24. In one embodiment, a thin bottom portion of the single crystalline buffer semiconductor layer 24 less than 1 micron in thickness may be undoped or doped at a low concentration of silicon.

A high quality single crystalline surface with low defect density can be provided at the top surface of the single crystalline buffer semiconductor layer 24. Optionally, the top surface of the single crystalline buffer semiconductor layer 24 may be planarized to provide a planar top surface, for example, by chemical mechanical planarization. A suitable surface clean process can be performed after the planarization process to remove contaminants from the top surface of the single crystalline buffer semiconductor layer 24. The average thickness of the single crystalline buffer semiconductor layer 24 may be in a range from 2 microns to 10 microns, although lesser and greater thicknesses can also be employed.

An n-doped compound semiconductor substrate layer 26 is subsequently formed directly on the top surface of the single crystalline buffer semiconductor layer 24. The n-doped compound semiconductor substrate layer 26 can be formed as a continuous material layer having a uniform thickness over the entire top surface of the single crystalline buffer semiconductor layer 24. The n-doped compound semiconductor substrate layer 26 includes an n-doped compound semiconductor material. The n-doped compound semiconductor substrate layer 26 can be lattice matched with the single crystalline compound semiconductor material of the top portion of the single crystalline buffer semiconductor layer 24. The n-doped compound semiconductor substrate layer 26 may, or may not, include the same compound semiconductor material as the top portion of the single crystalline buffer semiconductor layer 24. In one embodiment, the n-doped compound semiconductor substrate layer 26 can include an n-doped direct band gap compound semiconductor material. In one embodiment, the n-doped compound semiconductor substrate layer 26 can include n-doped gallium nitride (GaN), indium gallium nitride (InGaN) or other III-V semiconductor materials, such as gallium phosphide or its ternary or quarternary compounds. The deposition process for forming the n-doped compound semiconductor substrate layer 26 can employ any of metalorganic vapor phase epitaxy (MOVPE), molecular beam epitaxy (MBE), hydride vapor phase epitaxy (HVPE), liquid phase epitaxy (LPE), metal-organic molecular beam epitaxy (MOMBE), and atomic layer deposition (ALD). The thickness of the n-doped compound semiconductor substrate layer 26 can be in a range from 300 nm to 2 microns, although lesser and greater thicknesses can also be employed. The support substrate 22, the single crystalline buffer semiconductor layer 24, and the n-doped compound semiconductor substrate layer 26 collectively comprise a substrate 20.

In some embodiments (such as the embodiments illustrated in FIGS. 1A, 1B, 2A, 2B, 3A, and 3B), a patterned growth mask layer 42 can be formed on the top surface of the substrate 20 (e.g., on top of the n-doped compound semiconductor substrate layer 26). The patterned growth mask layer 42 can be formed, for example, by depositing a dielectric material layer and patterning the dielectric material layer to form openings therein. For example, a silicon nitride layer, a silicon oxide layer, or a dielectric metal oxide layer (such as an aluminum oxide layer) can be formed on the top surface of the substrate 20. In one embodiment, the dielectric material layer can include a silicon nitride layer. The thickness of the dielectric material layer can be in a range from 3 nm to 100 nm, although lesser and greater thicknesses can also be employed.

A photoresist layer (not shown) can be applied over the top surface of the dielectric material layer, and can be lithographically patterned to form openings therethrough by lithographic exposure and development. In one embodiment, the openings in the photoresist layer can be formed as a two-dimensional periodic array. The size and shape of each opening can be selected to optimize the shape and size of semiconductor structures to be subsequently formed by a selective deposition process (such as a selective epitaxy process). The pattern of the openings in the photoresist layer can be transferred through the dielectric material layer to form the patterned growth mask layer 42. The photoresist layer can be subsequently removed, for example, by ashing. Alternatively, the growth mask layer can be patterned using electron beam lithography or nano-imprint lithography followed by etching. The patterned growth mask layer 42 includes openings, which may, or may not, be arranged as a two-dimensional periodic array. The shape of each opening may be circular, elliptical, or polygonal (such as hexagonal). A portion of the top surface of the n-doped compound semiconductor substrate layer 26 is physically exposed underneath each opening through the patterned growth mask layer 42.

The single crystalline buffer semiconductor layer 24, the n-doped compound semiconductor substrate layer 26, and additional structures to be formed thereupon will be subsequently patterned to define an array of subpixels, which is an array of light emitting diodes 10. Thus, each subsequently patterned area of the single crystalline buffer semiconductor layer 24 and the n-doped compound semiconductor substrate layer 26 will correspond to the area of a respective light emitting diode 10. For example, the array of light emitting diodes 10 may be formed as a rectangular array or a hexagonal array, and each light emitting diode 10 may be formed with a maximum lateral dimension (such as the diagonal of a rectangular shape or the diameter of a circumscribing circle of a hexagonal shape) in a range from 1 micron to 60 microns, such as from 2 micron to 30 microns. For example, the maximum lateral dimension of each opening through the patterned growth mask layer 42 may be in a range from 50 nm to 50 microns (such as from 200 nm to 10 microns), although lesser and greater dimensions may also be employed.

In an alternative embodiment, the single crystalline buffer semiconductor layer 24 and the n-doped compound semiconductor substrate layer 26 are patterned by a combination of a lithographic process and an anisotropic etch prior to formation of the additional structures (e.g., epitaxial growth of subsequent semiconductor materials) on the n-doped compound semiconductor substrate layer 26. For example, a photoresist layer can be applied over the n-doped compound semiconductor substrate layer 26, and is lithographically patterned to cover each discrete area of light emitting diodes 10. For example, two sets of line trenches extending along orthogonal horizontal directions can be formed through the n-doped compound semiconductor substrate layer 26 and the single crystalline buffer semiconductor layer 24 to form a rectangular array of patterned portions of the n-doped compound semiconductor substrate layer 26 and the single crystalline buffer semiconductor layer 24. The photoresist layer can be subsequently removed.

Figure 1B:
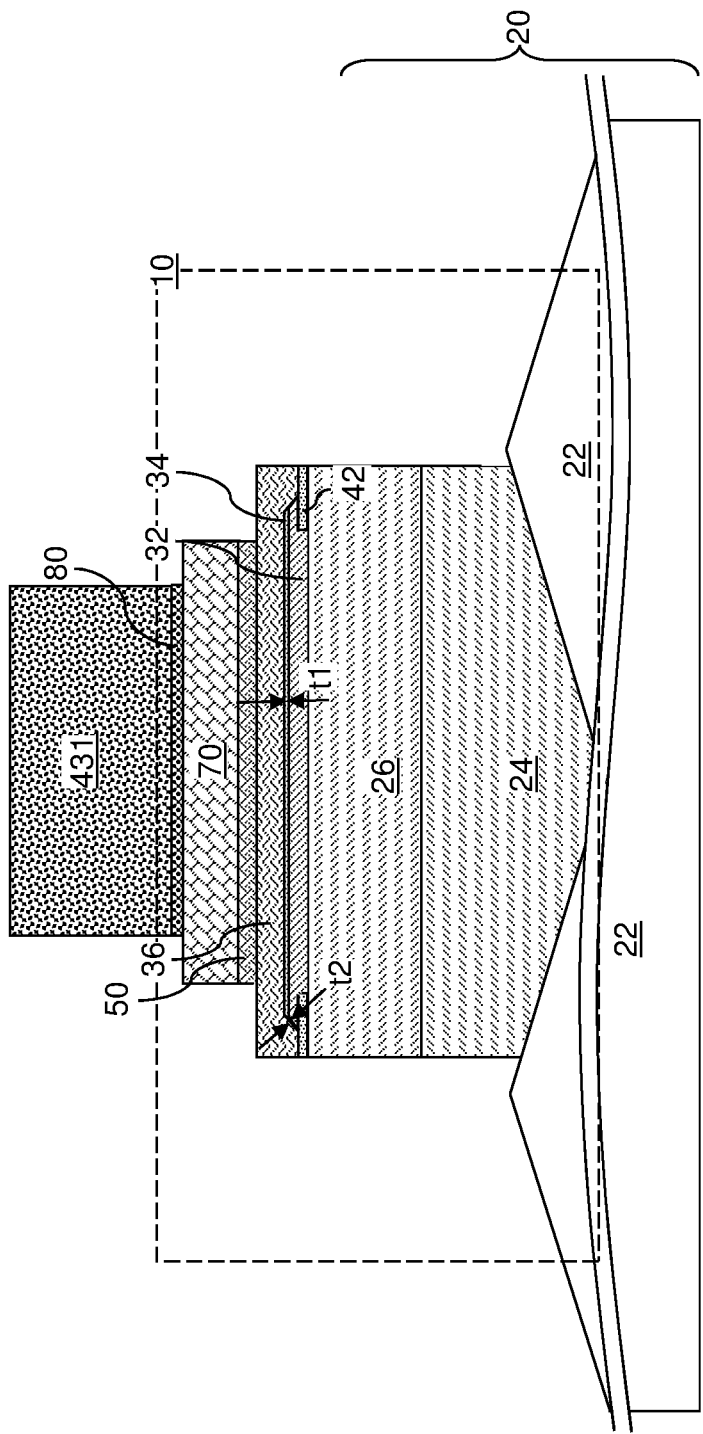
FIG. 1B is a vertical cross-sectional view of the first configuration of a light emitting diode after patterning a tin portion according to an embodiment of the present disclosure.

In configurations such as the configurations of FIGS. 1A and 1B, each area for a light emitting diode 10 includes a respective single opening in the patterned growth mask layer 42. In configurations such as the configurations of FIGS. 2A, 2B, 3A, and 3B, each area for a light emitting diode 10 includes a respective array of openings in the patterned growth mask layer 42.

In some other embodiments (such as the embodiments illustrated in FIGS. 4A and 4B), the patterned growth mask layer 42 is not employed. In this case, continuous planar semiconductor layers are formed on the n-doped compound semiconductor substrate layer 26.

N-doped compound semiconductor regions 32 can be grown through, and over, the growth mask layer 42 by a selective compound semiconductor deposition process, which can be a selective epitaxy process. The shapes and sizes of the n-doped compound semiconductor regions 32 can be determined based on the shapes and dimensions of the openings through the growth mask layer 42 and by the process conditions of the selective compound semiconductor deposition process. The n-doped compound semiconductor regions 32 can be formed with various crystallographic facets located within a respective crystallographic plane. As used herein, a "p-plane" means a "pyramid plane," which can by any of the $\{1\bar{1}01\}$ planes in the III-nitride system, a "c-plane" represents a $\{0001\}$ plane, and an "m-plane" represents any of the $\{1\bar{1}00\}$ planes. Growth rates generally differ among the different crystallographic planes. A "growth rate" herein means a layer growth rate along the direction perpendicular to a growth surface when not otherwise specified. In one embodiment, the top surface of the n-doped compound semiconductor substrate layer 26 can be within a c-plane. The height of each n-doped compound semiconductor region 32 can be in a range from 50 nm to 10 microns, such as from 200 nm to 2 microns, although lesser and greater heights can also be employed. In some embodiments, an anneal at an elevated temperature that induces migration of deposited semiconductor materials, a partial etch back process, and/or chemical mechanical planarization process may be optionally employed to provide planar top surfaces and/or faceted surfaces.

In some embodiments (such as the embodiments illustrated in FIGS. 1A and 1B), the n-doped compound semiconductor regions 32 can be formed as microdiscs. As used herein, a disc refers to a structural element having a top surface and a bottom surface that are parallel to each other and the area of the top surface is greater than the total area of surfaces (such as faceted surfaces or sidewall surfaces) that are not parallel to the top surface. A "microdisc" refers to a disc for which the maximum lateral dimension of the top surface is at least 1 micron and is less than 1 mm. A microdisc may have a circular, oval or polygonal (e.g., rectangular, hexagonal, etc.) when viewed from above.

In some embodiments (such as the embodiments illustrated in FIGS. 2A and 2B), the n-doped compound semiconductor regions 32 can be formed as nanodiscs. A "nanodisc" refers to a disc for which the maximum lateral dimension of the top surface is at least 1 nm and less than 1 micron. A cluster of microdiscs or nanodiscs can be formed for each area of a light emitting diode 10.

In some embodiments (such as the embodiments illustrated in FIGS. 3A and 3B), the n-doped compound semiconductor regions 32 can be formed as nanowire cores, microwire cores, nanopyramids, micropyramids, nanofrustums, microfrustums, combinations thereof, or other nanoscale structures or microscale structures. A "nanowire" refers to a structure extending along a lengthwise direction (such as a vertical direction) and having a maximum vertical dimension that is greater than a maximum lateral dimension that is at least than 1 nm and less than 1 micron, and including a region of a substantially uniform cross-sectional shape along the direction perpendicular to the lengthwise direction. A "microwire" refers to a structure extending along a lengthwise direction (such as a vertical direction) and having a maximum vertical dimension that is greater than a maximum lateral dimension that is at least 1 micron and less than 1 mm, and including a region of a substantially uniform cross-sectional shape along the direction perpendicular to the lengthwise direction. A "nanopyramid" refers to a conical structure having a base of a polygonal or otherwise generally curvilinear shape such that the maximum lateral dimension of the base is at least than 1 nm and less than 1 micron. A "micropyramid" refers to a conical structure having a base of a polygonal or otherwise generally curvilinear shape such that the maximum lateral dimension of the base is at least than 1 micron and less than 1 mm. A "nanofrustum" refers to a frustum (i.e., a conical structure without a region around an apex) having a base of a polygonal or otherwise generally curvilinear shape such that the maximum lateral dimension of the base is at least than 1 nm and less than 1 micron. A "microfrustum" refers to a frustum having a base of a polygonal or otherwise generally curvilinear shape such that the maximum lateral dimension of the base is at least than 1 micron and less than 1 mm. If the top surface of the n-doped compound semiconductor substrate layer 26 is within a c-plane, the nanowires and the microwires may include m-planes, p-planes, and optionally a respective c-plane. The nanopyramids, the micropyramids, the nanofrustums, and the microfrustums may include p-planes. The nanofrustums and the microfrustums may include c-planes.

Selective epitaxy processes that may be employed to form the n-doped compound semiconductor regions 32 are described, for example, in U.S. Pat. No. 9,444,007 to Kryliouk et al., U.S. Pat. No. 9,419,183 to Lowgren et al., U.S. Pat. No. 9,281,442 to Romano et al., and U.S. Pat. No. 8,669,574 to Konsek et al., each of which is assigned to Glo AB and is incorporated herein by reference in their entirety.

In some embodiments (such as the embodiments illustrated in FIGS. 4A and 4B), the epitaxy of the n-doped compound semiconductor region 32 may be performed without employing a patterned growth mask 42 on all physically exposed surfaces of an array of patterned portions of the n-doped compound semiconductor substrate layer 26. In this embodiment, n-doped compound semiconductor region 32 comprises a continuous planar semiconductor layer.

Subsequently, an active region 34 including an optically active compound semiconductor layer stack configured to emit light is formed on each n-doped compound semiconductor region 32. Each active region 34 includes at least one semiconductor material that emits light upon application of a suitable electrical bias. For example, each active region 34 can include a single or a multi-quantum well (MQW) structure that emits light upon application of an electrical bias thereacross. For example, the quantum well(s) may comprise indium gallium nitride well(s) located between gallium nitride or aluminum gallium nitride barrier layers. Alternatively, the active regions 34 can include any other suitable semiconductor layers (e.g., such as gallium phosphide or its ternary or quarternary compounds) or stack of layers for light emitting diode applications provided that it can be grown on the surfaces of the n-doped compound semiconductor regions 32. The set of all layers within an active region 34 is herein referred to as an active layer.

In one embodiment, each of the plurality of active regions 34 includes a respective optically active compound semiconductor layer stack configured to emit light. In a non-limiting illustrative example, the active region 34 can include a layer stack including, from bottom to top, a silicon-doped GaN layer having a thickness of 30 nm to 70 nm, such as about 50 nm to about 60 nm, a GaN layer having a thickness of 2 nm to 10 nm, such as about 5 nm to 7 nm, an InGaN layer having a thickness of 1 nm to 5 nm, such as about 3 nm to 4 nm, and a GaN barrier layer having a thickness of 10 nm to 30 nm, such as about 15 nm to 20 nm. Optionally, an AlGaN cap layer may be formed on the InGaN layer for red LEDs. The sequence of layers, composition of each layer, and the thickness of each layer within each active region 34 can be optimized to increase emission intensity and to provide the target peak emission wavelength. The active regions 34 may emit any color light, such as blue, green or red light depending on the composition of the semiconductor material therein and the strain that is applied to the semiconductor material.

A selective epitaxy process can be employed to grow the active regions 34. The process parameters of the selective epitaxy process can be selected such that the active regions 34 are grown as conformal structures having a same thickness throughout. In another embodiment, the active regions 34 can be grown as a pseudo-conformal structure in which the horizontal portions have the same thickness (such as a first thickness t1) throughout, and faceted portions have a thickness (such as a second thickness t2) that is less than the thickness of the horizontal portions. In one embodiment, each of the plurality of active regions 34 can include a top planar portion having the first thickness t1 and sidewall portions overlying tapered planar sidewalls of a respective one of the n-doped compound semiconductor regions 32 and having the second thickness t2. In one embodiment, the ratio of the first thickness t1 to the second thickness t2 can be in a range from 2 to 50, although lesser and greater ratios can also be employed. Methods for growing a layer stack for active regions 34 on nanowires are described, for example, in U.S. Pat. No. 9,444,007 to Krylouk et al., U.S. Pat. No. 9,419,183 to Lowgren et al., U.S. Pat. No. 9,281,442 to Romano et al., and U.S. Pat. No. 8,669,574 to Konsek et al. An active region 34 contacts, surrounds, and overlies an underlying n-doped compound semiconductor region 32. In one embodiment shown in FIGS. 1A, 1B, 4A and 4B, a single active region 34 can be formed per light emitting diode 10. In another embodiment shown in FIGS. 2A to 3B, a cluster of active regions 34 can be formed per light emitting diode 10.

A p-doped semiconductor material layer 36 is formed on the planar top surfaces and faceted outer surfaces of the active regions 34. The p-doped semiconductor material layer 36 includes a doped semiconductor material having a doping of a second conductivity type, which is the opposite of the first conductivity type. For example, if the first conductivity type is n-type, then the second conductivity type is p-type. If the first conductivity type is p-type, then the second conductivity type is n-type.

The p-doped semiconductor material layer 36 can include a compound semiconductor material. The compound semiconductor material of the p-doped semiconductor material layer 36 can be any suitable semiconductor material, such as p-type III-nitride compound semiconductor material, e.g., gallium nitride and/or aluminum gallium nitride. In one embodiment, the n-doped compound semiconductor regions 32 can include n-doped GaN or InGaN, and the p-doped semiconductor material layer 36 can include p-doped AlGaN and/or GaN. Alternatively, regions 32 and/or layer 36 can include other semiconductor materials, such as such as gallium phosphide or its ternary or quarternary compounds.

The p-doped semiconductor material layer 36 can be formed by selective deposition of the doped semiconductor material on the outer surfaces of the active regions 34. For example, a selective epitaxy process can be employed. During the selective deposition process (which can be a selective epitaxy process), discrete semiconductor material portions grow from the outer surfaces of each of the active regions until the discrete semiconductor material portions merge to form the p-doped semiconductor material layer 36 as a continuous semiconductor material layer within the area of each light emitting diode 10. In case portions of the top surface of the growth mask layer 42 are not covered by the n-doped compound semiconductor regions 32 or the active regions 34, the bottom surface of the p-doped semiconductor material layer 36 may contact such portions of the top surface of the growth mask layer 42.

Figure 1C:
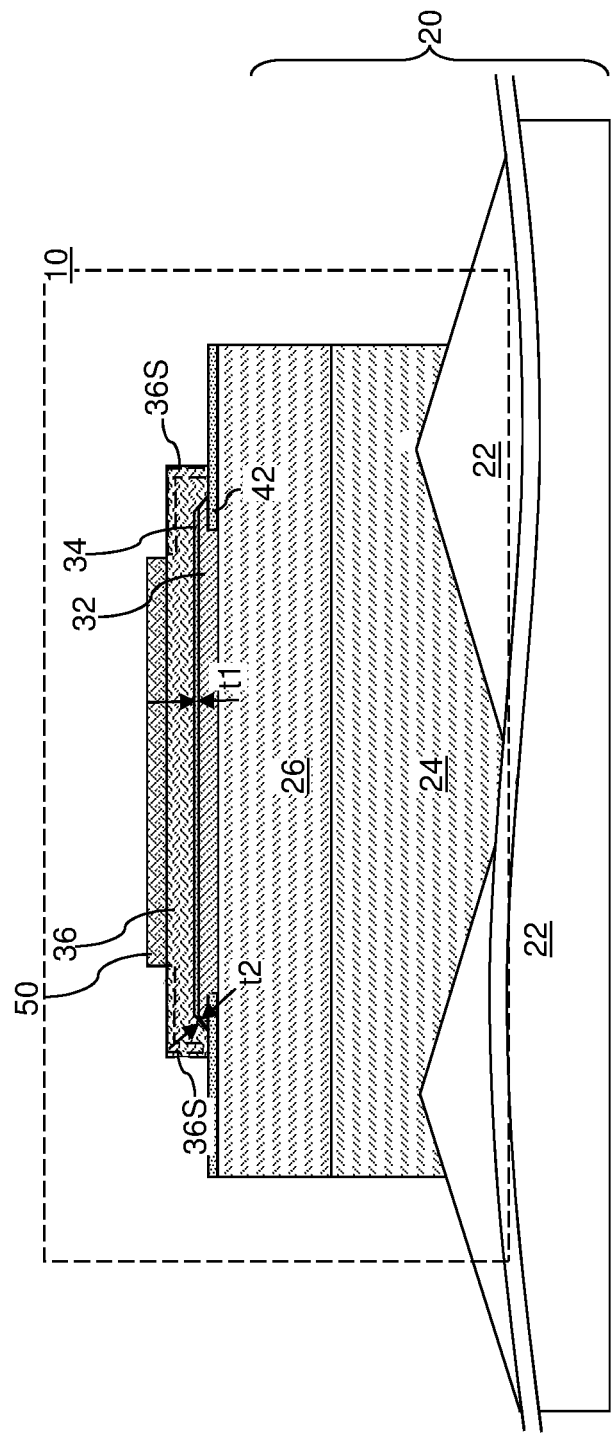
FIG. 1C is a vertical cross-sectional view of a second configuration of a light emitting diode after formation of a reflector and performing a dopant deactivation treatment according to an embodiment of the present disclosure.
Figure 1D:
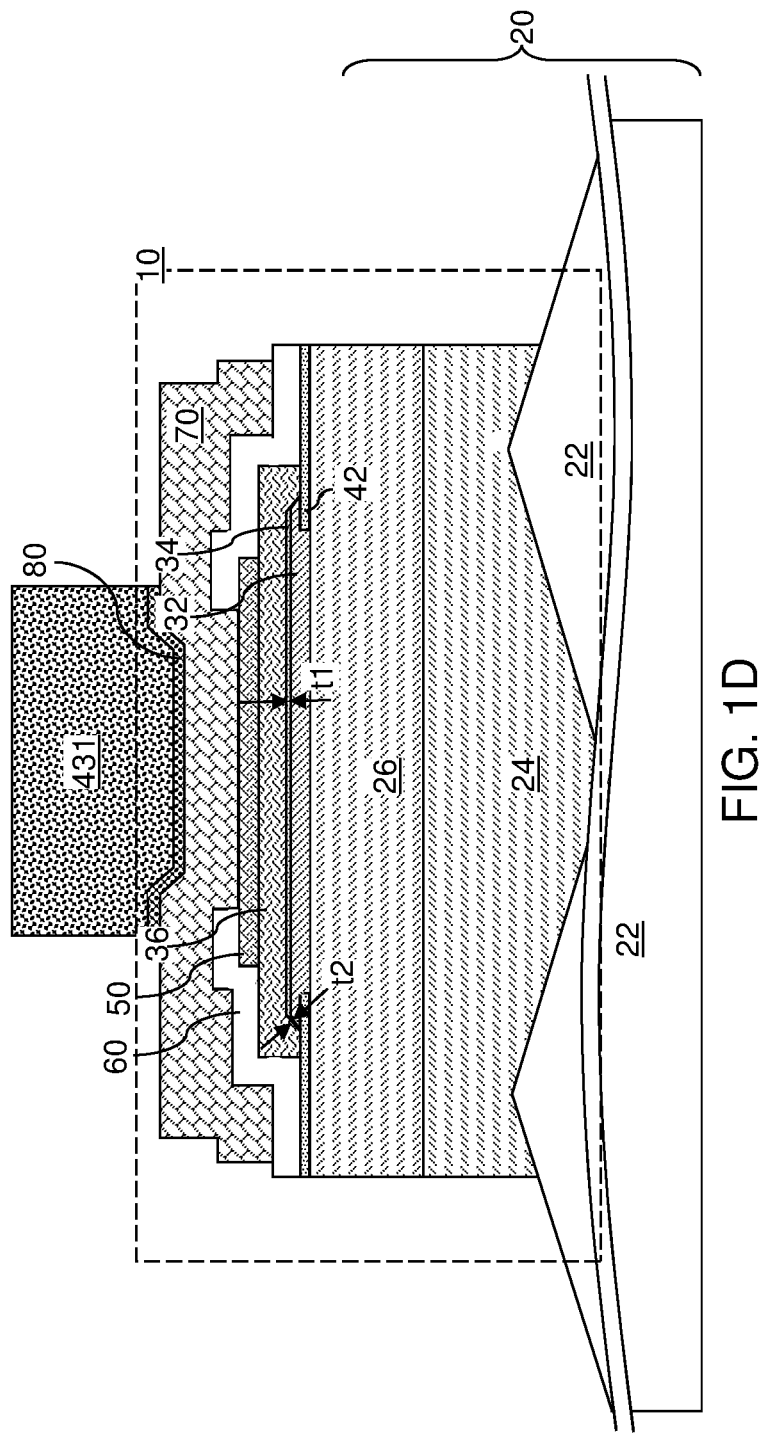
FIG. 1D is a vertical cross-sectional view of the second configuration of a light emitting diode after patterning a tin portion according to an embodiment of the present disclosure.
Figure 2A:
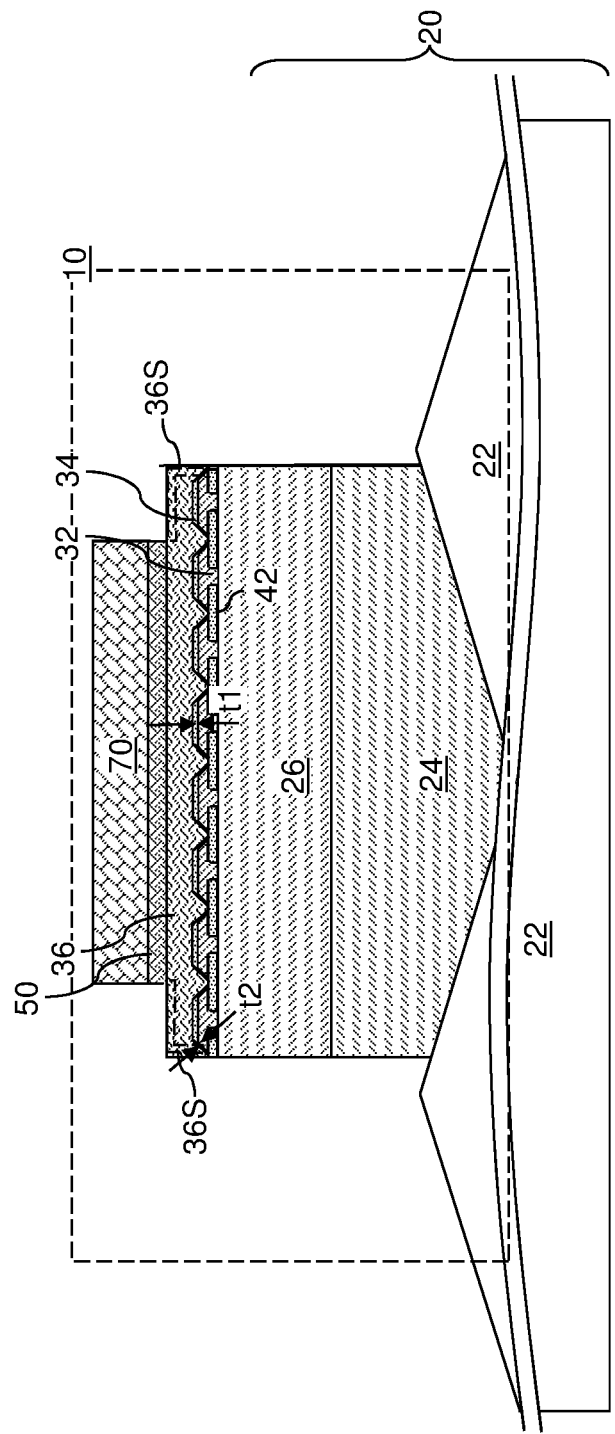
FIG. 2A is a vertical cross-sectional view of a third configuration of a light emitting diode after formation of a reflector and performing a dopant deactivation treatment according to an embodiment of the present disclosure.
Figure 2B:
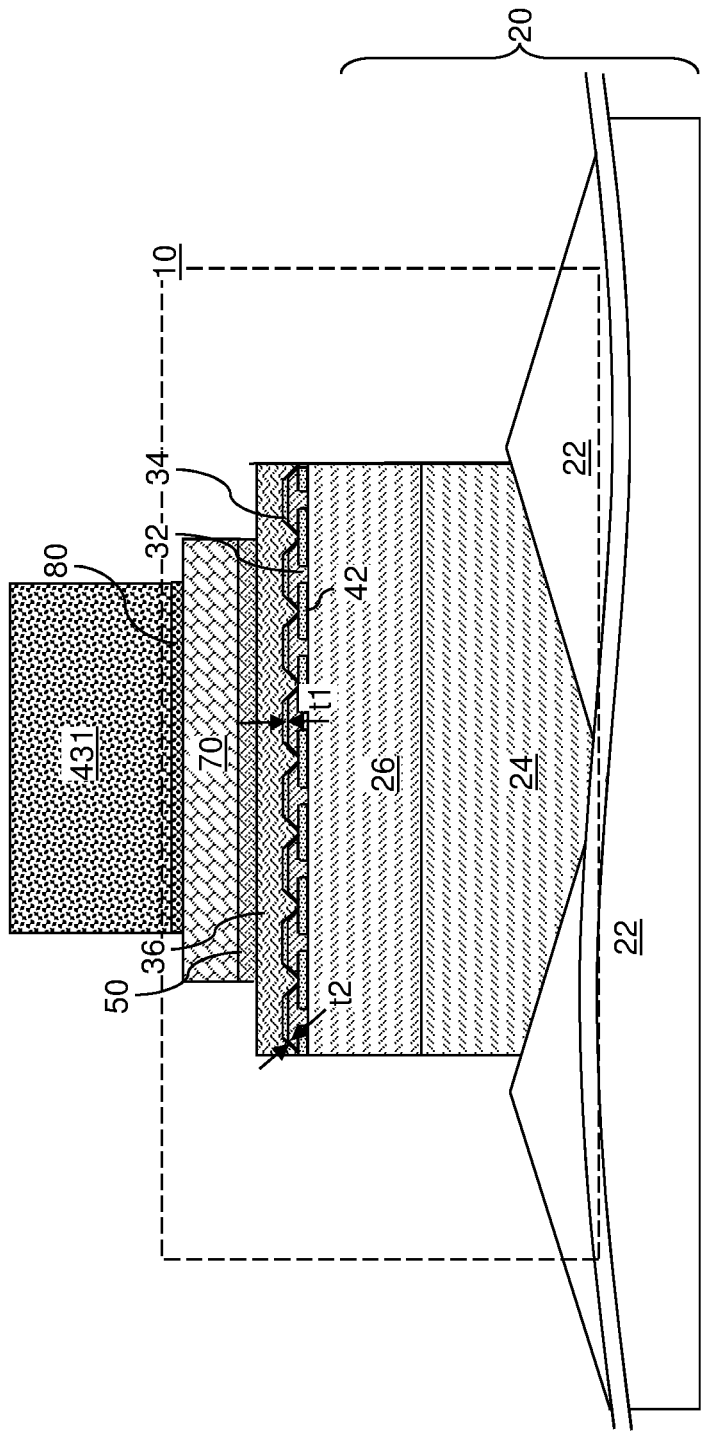
FIG. 2B is a vertical cross-sectional view of the third configuration of a light emitting diode after patterning a tin portion according to an embodiment of the present disclosure.
Figure 2D:
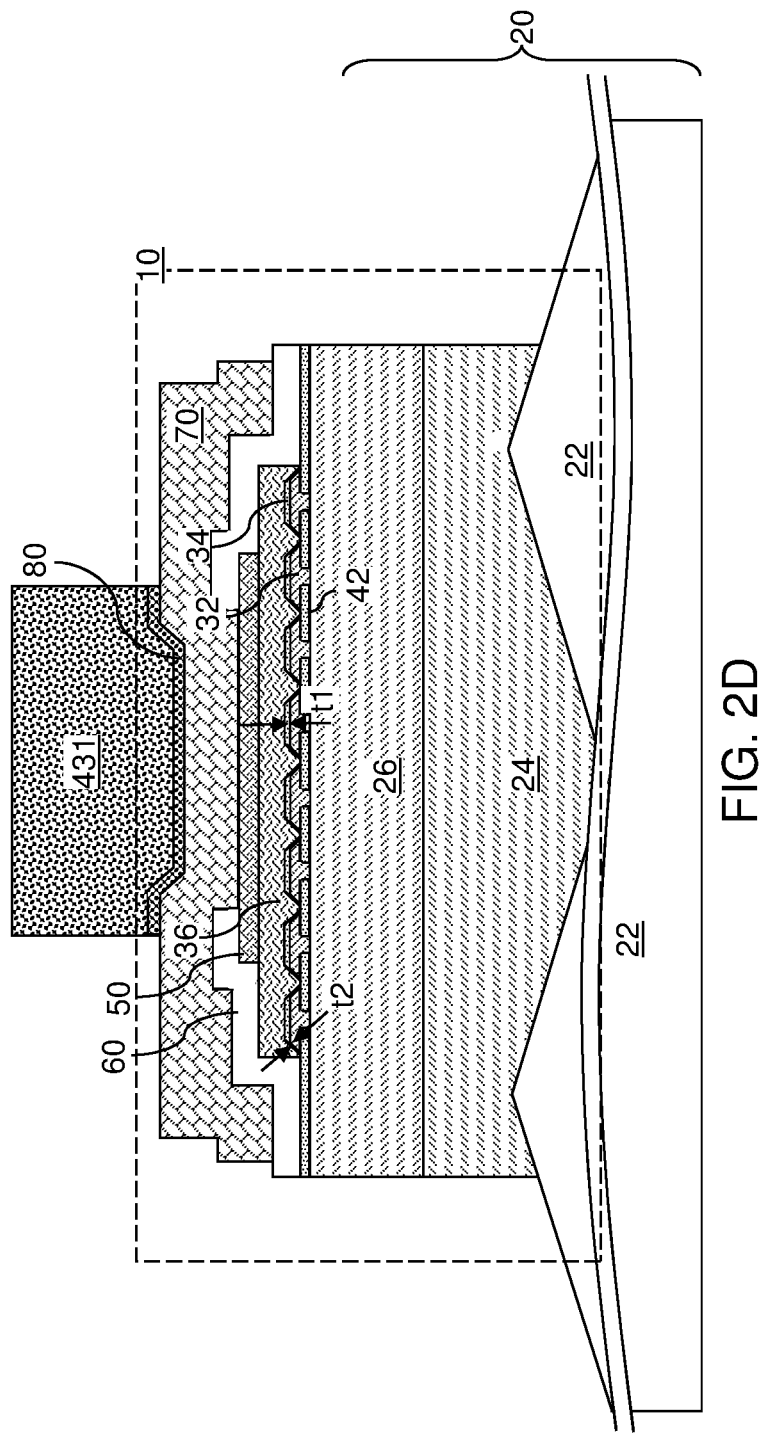
FIG. 2D is a vertical cross-sectional view of the fourth configuration of a light emitting diode after patterning a tin portion according to an embodiment of the present disclosure.
Figure 3C:
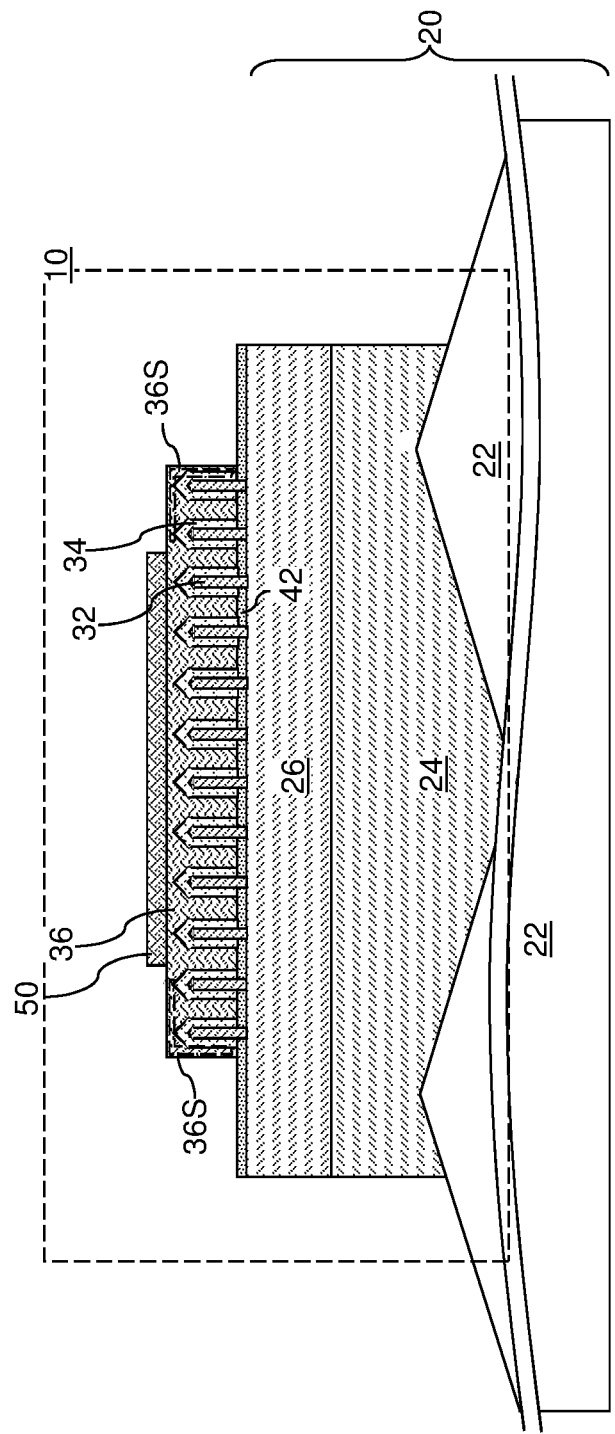
FIG. 3C is a vertical cross-sectional view of a sixth configuration of a light emitting diode after formation of a reflector and performing a dopant deactivation treatment according to an embodiment of the present disclosure.
Figure 3D:
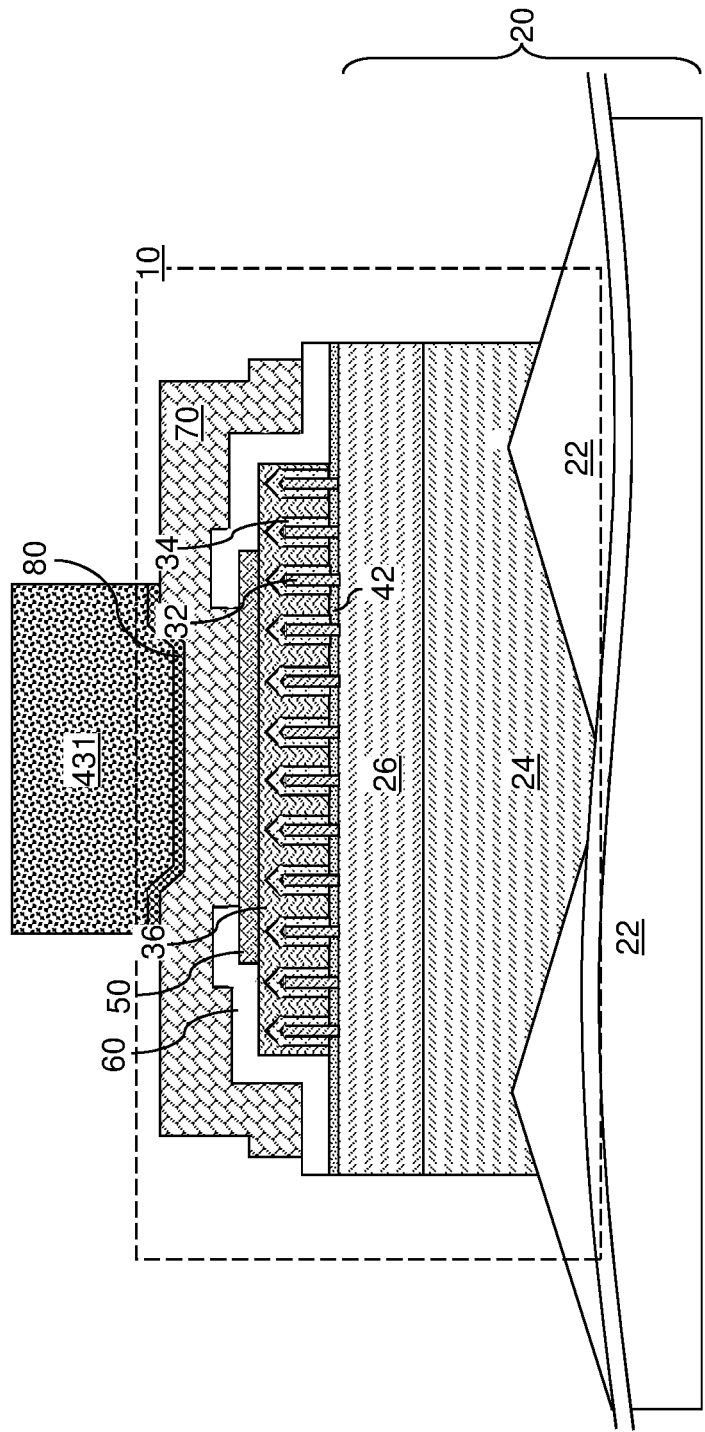
FIG. 3D is a vertical cross-sectional view of the sixth configuration of a light emitting diode after patterning a tin portion according to an embodiment of the present disclosure.
Figure 4A:
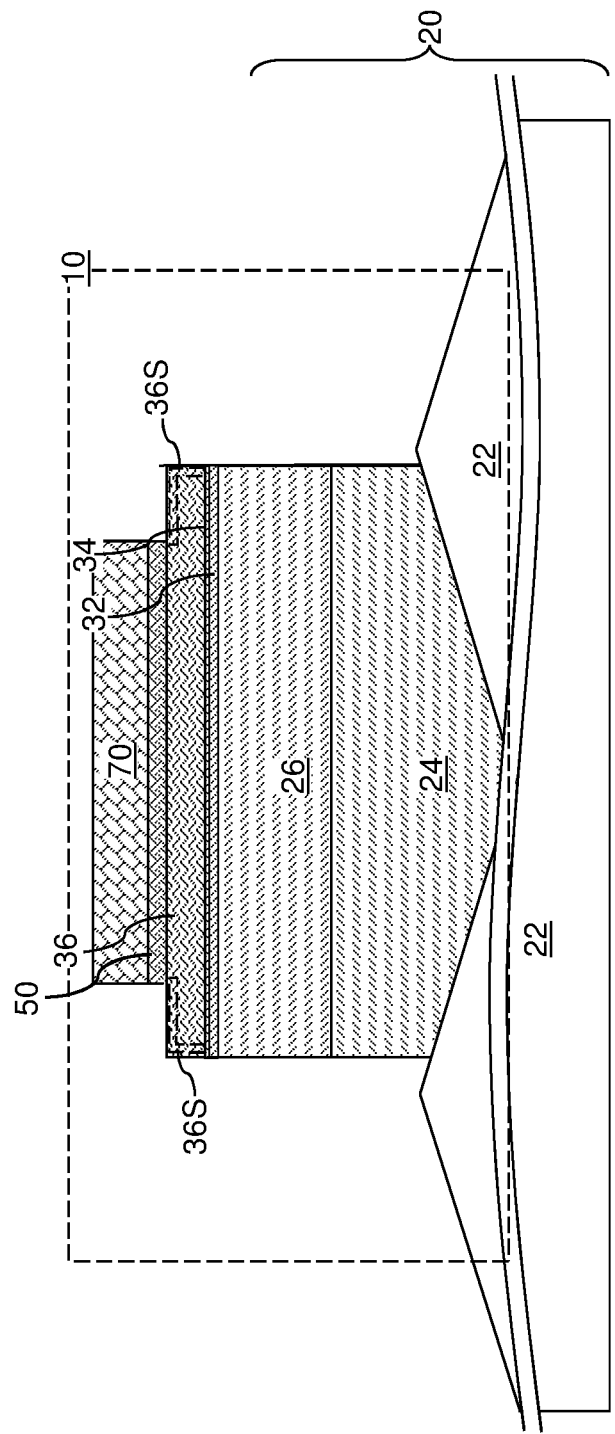
FIG. 4A is a vertical cross-sectional view of a seventh configuration of a light emitting diode after formation of a reflector and performing a dopant deactivation treatment according to an embodiment of the present disclosure.
Figure 4B:
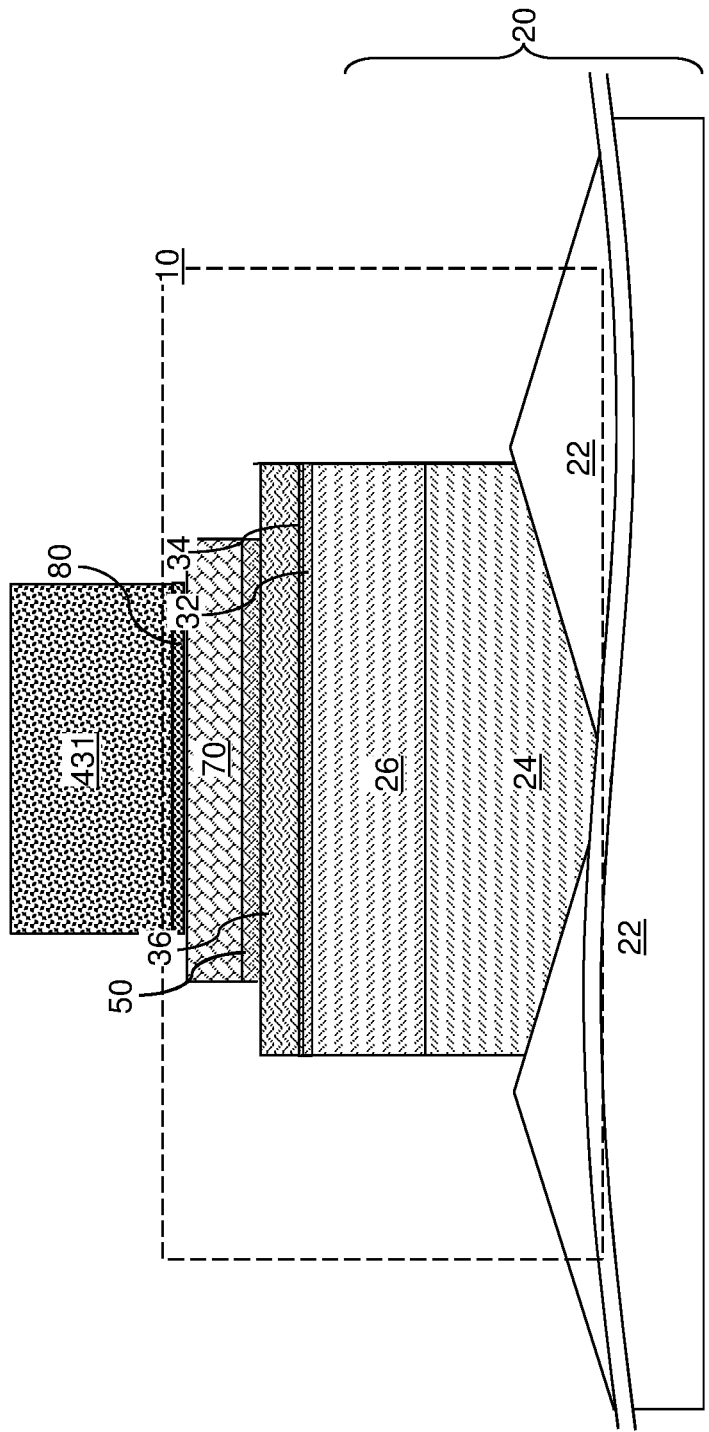
FIG. 4B is a vertical cross-sectional view of the seventh configuration of the light emitting diode after patterning a tin portion according to an embodiment of the present disclosure.
Figure 4C:
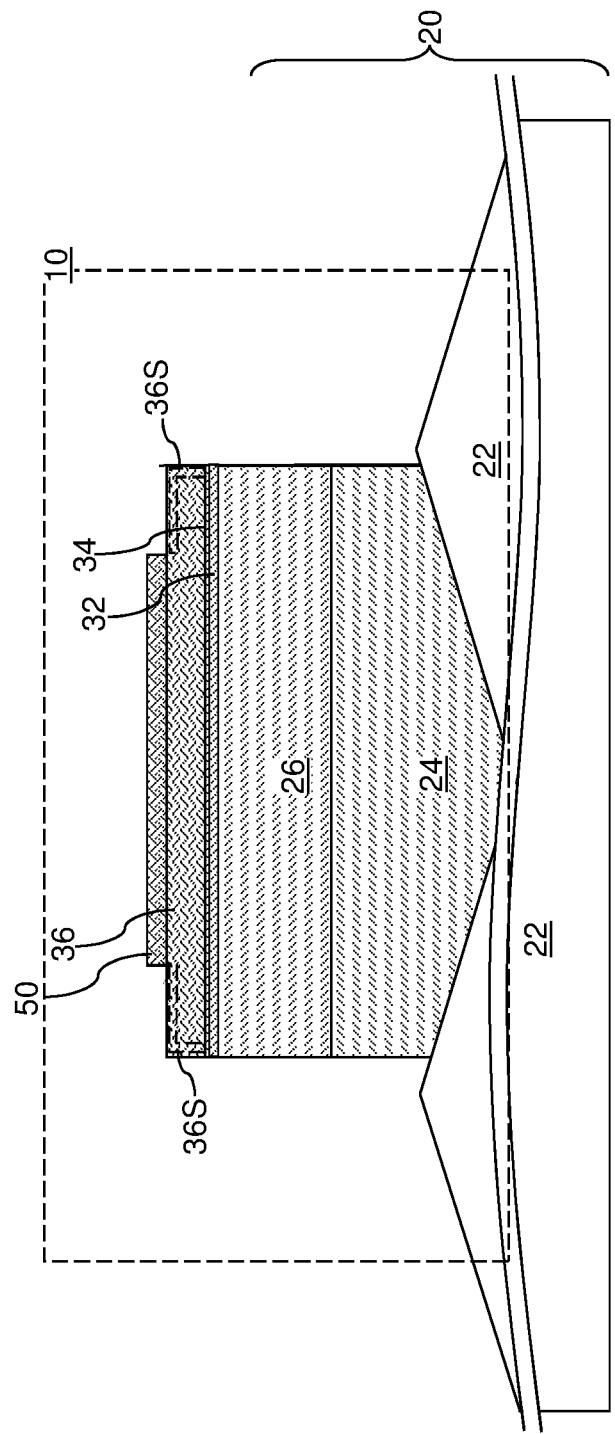
FIG. 4C is a vertical cross-sectional view of an eighth configuration of a light emitting diode after formation of a reflector and performing a dopant deactivation treatment according to an embodiment of the present disclosure.
Figure 4D:
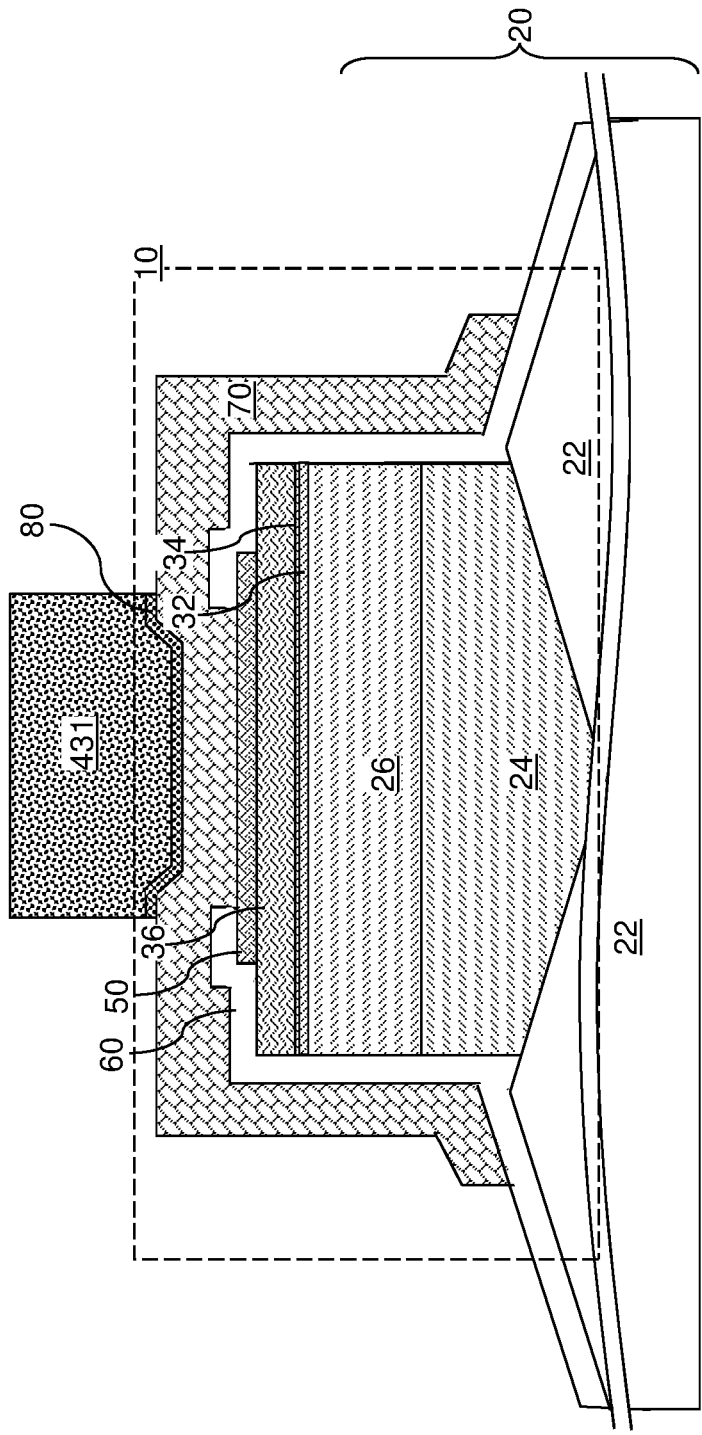
FIG. 4D is a vertical cross-sectional view of the eighth configuration of a light emitting diode after patterning a tin portion according to an embodiment of the present disclosure.

An anode contact 50 can be formed on the top surface of the p-doped semiconductor material layer 36. FIGS. 5A-5D illustrate various configurations for the p-doped semiconductor material layer 36 that can be incorporated into any of the light emitting diodes 10 illustrated in FIGS. 1A, 1C, 2A, 2C, 3A, 3C, 4A, and 4C. In some embodiments, stack of the anode contact 50 and a reflector 70 can be deposited on the p-doped semiconductor material layer 36, and can be patterned as illustrated in FIGS. 1A, 2A, 3A, and 4A. In some other embodiment, the anode contact 50 is deposited and patterned on the p-doped semiconductor material layer 36 prior to deposition of a reflector as illustrated in FIGS. 1C, 2C, 3C, and 3C.

Figure 5B:
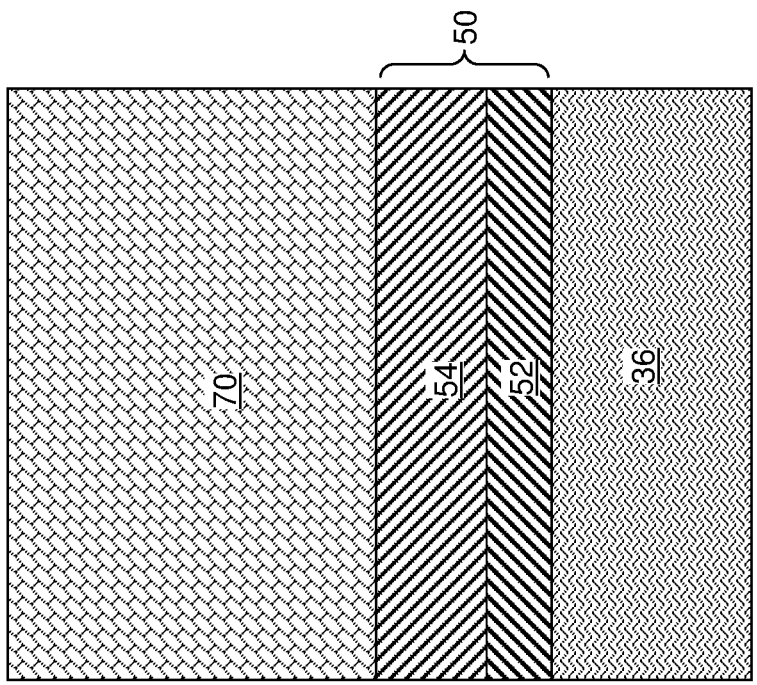
FIG. 5B illustrates of a second configuration of an anode contact according to an embodiment of the present disclosure.
Figure 5A:
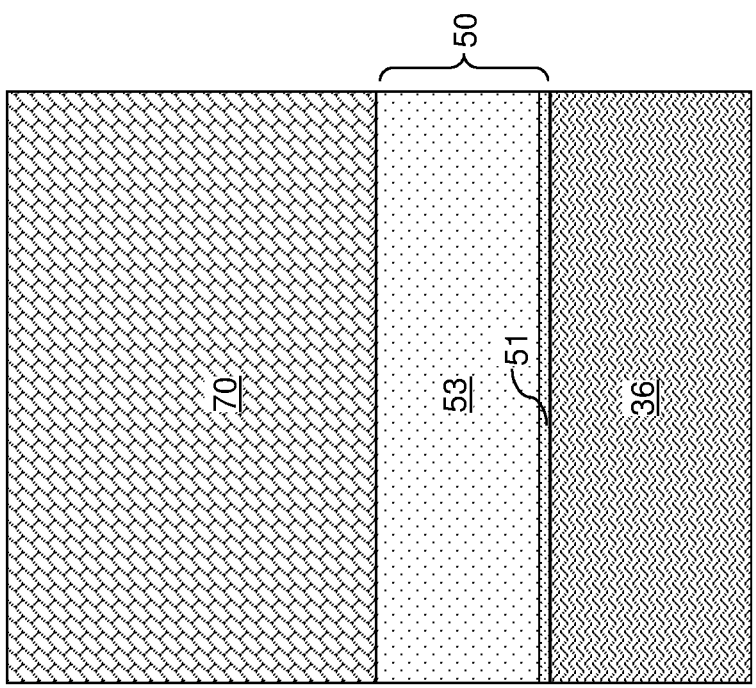
FIG. 5A illustrates of a first configuration of an anode contact according to an embodiment of the present disclosure.

FIG. 5A illustrates a first configuration of the anode contact 50. In the first configuration, the anode contact 50 can include a nickel oxide layer 51 and a transparent conductive oxide layer 53. The nickel oxide layer 51 can be formed by conformal or non-conformal deposition of nickel, and by subsequent oxidation of the deposited nickel portions. A nickel layer can be deposited, for example, by physical vapor deposition (PVD), vacuum evaporation, or chemical vapor deposition. The thickness of the nickel layer can be in a range from 0.3 nm to 100 nm, such as from 1 nm to 10 nm, although lesser and greater thicknesses can also be employed. Oxidation of the nickel layer may be performed by a thermal oxidation process or a plasma oxidation process. Alternatively, if the nickel layer is thin enough, oxygen atoms can be provided from the transparent conductive oxide layer 53 that is subsequently deposited. The thickness of the nickel oxide layer 51 can be in a range from 0.4 nm to 130 nm, such as from 1.3 nm to 13 nm, although lesser and greater thicknesses can also be employed. The nickel oxide layer 51 enhances adhesion between the p-doped semiconductor material layer 36 and the transparent conductive oxide layer 53. In one embodiment, the anode contact 50 can comprise a surface layer of nickel oxide having a thickness less than 3 nm, which can be, for example, in a range from 0.4 nm to 3 nm.

The transparent conductive oxide layer 53 can be deposited over the p-doped semiconductor material layer 36. The transparent conductive oxide layer 53 can be deposited as a continuous material layer that extends across the entire area of the p-doped semiconductor material layer 36. The thickness of the transparent conductive oxide layer 53 can be in a range from 50 nm to 600 nm, such as from 10 nm to 300 nm, although lesser and greater thicknesses can also be employed. The transparent conductive oxide layer 53 includes a transparent conductive oxide material such as a material selected from doped zinc oxide, indium tin oxide, cadmium tin oxide ($Cd_2SnO_4$), zinc stannate ($Zn_2SnO_4$), and doped titanium dioxide ($TiO_2$). Exemplary doped zinc oxide materials include boron-doped zinc oxide, fluorine doped zinc oxide, gallium doped zinc oxide, and aluminum doped zinc oxide. In one embodiment, the anode contact 50 cam be optically transparent.

FIG. 5B illustrates a second configuration of the anode contact 50. In the second configuration, the anode contact 50 can include an adhesion metal layer 52 and a silver layer 54. The combination of the adhesion metal layer 52 and the silver layer 54 provides good adhesion of the reflector 70 to be subsequently formed to the p-doped semiconductor material layer 36 as well as good electrical contact to the p-doped semiconductor material layer 36. The adhesion metal layer 52 directly contacts the p-doped semiconductor material layer 36. The material of the adhesion metal layer 52 can be an elemental metal that promotes adhesion. For example, the adhesion metal layer 52 can be a platinum layer consisting essentially of platinum or a nickel layer consisting essentially of nickel. The adhesion metal layer 52 can be deposited, for example, by physical vapor deposition. The thickness of the adhesion metal layer 52 (as measured over a horizontal surface) can be in a range from 2 nm to 200 nm, such as from 5 nm to 100 nm, although lesser and greater thicknesses can also be employed. The silver layer 54 can consist essentially of silver, and can be formed, for example, by physical vapor deposition. The thickness of the silver layer 54 (as measured over a horizontal surface) can be in a range from 2 nm to 200 nm, such as from 5 nm to 100 nm, although lesser and greater thicknesses can also be employed.

FIG. 5C illustrates a third configuration of the anode contact 50. In the third configuration, the anode contact 50 can consist of a silver layer 54 that directly contacts the p-doped semiconductor material layer 36. The silver layer 54 can consist essentially of silver, and can be formed, for example, by physical vapor deposition. The thickness of the silver layer 54 (as measured over a horizontal surface) can be in a range from 2 nm to 200 nm, such as from 5 nm to 100 nm, although lesser and greater thicknesses can also be employed.

FIG. 5D illustrates a fourth configuration of the anode contact 50. In the fourth configuration, the anode contact 50 can be an NiO:Au composite layer 55 including NiO:Au composites including NiO region and Au regions. The NiO:Au composite layer 55 can be formed by forming a nickel oxide layer and depositing gold, and inducing interdiffusion of gold into the nickel oxide layer. The gold atoms segregate among the nickel oxide matrix to form the NiO:Au composite layer 55.

Alternatively, gold may be deposited first, and nickel oxide may be formed subsequently. Yet alternately, gold and nickel may be deposited as a stack of at least two layers, and oxidation and interdiffusion may be induced by thermal oxidation of nickel into nickel oxide to form the NiO:Au composite layer 55. The thickness of the NiO:Au composite layer 55 can be in a range from 2 nm to 200 nm, such as from 5 nm to 100 nm, although lesser and greater thicknesses can also be employed.

An optional dielectric material layer 60 can be subsequently formed on the physically exposed surfaces of the exemplary structure in the embodiments of FIGS. 1B, 2B, 3B and 4B. The dielectric material layer 60 includes a dielectric (electrically insulating) material such as silicon oxide, silicon nitride, organosilicate glass, silicone, a resin, a self-planarizing dielectric material, or another dielectric material. In one embodiment, the dielectric material layer 60 can be formed by a conformal deposition process such as low pressure chemical vapor deposition (LPCVD). Alternatively, the dielectric material layer 60 can be formed by plasma enhanced chemical vapor deposition (PECVD) or spin-coating. The thickness of the portion of the dielectric material layer 60 that overlies horizontal surfaces of the anode contact 50 can be in a range from 50 nm to 1,000 nm, such as from 100 nm to 500 nm, although lesser and greater thicknesses can also be employed.

The dielectric material layer 60 can be subsequently patterned to provide an opening above each anode contact 50. For example, a photoresist layer can be applied over the exemplary structure, and can be lithographically patterned to form openings within each periphery of the anode contacts 50. An anisotropic etch process or an isotropic etch process can be performed employing the patterned photoresist layer as an etch mask layer. For example, if the dielectric material layer 60 includes silicon oxide, an isotropic etch process employing dilute hydrofluoric acid can be employed to form openings through the dielectric material layer 60. The area of each opening through the dielectric material layer 60 may be in a range from 10% to 90% of the area of an underlying anode contact 50. The sidewalls of the dielectric material layer 60 around the openings may be tapered or may be vertical. The photoresist layer can be subsequently removed, for example, by ashing.

In one embodiment, the patterning of the stack of the anode contact 50 and a reflector 70 as illustrated in FIGS. 1A, 2A, 3A, and 4A or the patterning of the anode contact 50 as illustrated in FIGS. 1C, 2C, 3C, and 4C can be effected by applying an patterning a photoresist layer over the stack of the anode contact 50 and a reflector 70, or over the anode contact 50, and performing an etch process that etches the materials of the stack of the anode contact 50 and a reflector 70, or the material of the anode contact 50. An isotropic etch process (such as a wet etch process) or an anisotropic etch process (such as a reactive ion etch process) can be performed. Alternatively, a patterned photoresist layer can be formed on the top surface of the p-doped semiconductor material layer 36, and the materials of the stack of the anode contact 50 and a reflector 70, or the material of the anode contact 50, can be deposited, followed by a lift-off process that forms the stack of the anode contact 50 and a reflector 70 as illustrated in FIGS. 1A, 2A, 3A, and 4A or the patterning of the anode contact 50 as illustrated in FIGS. 1C, 2C, 3C, and 4C.

Figure 5E:
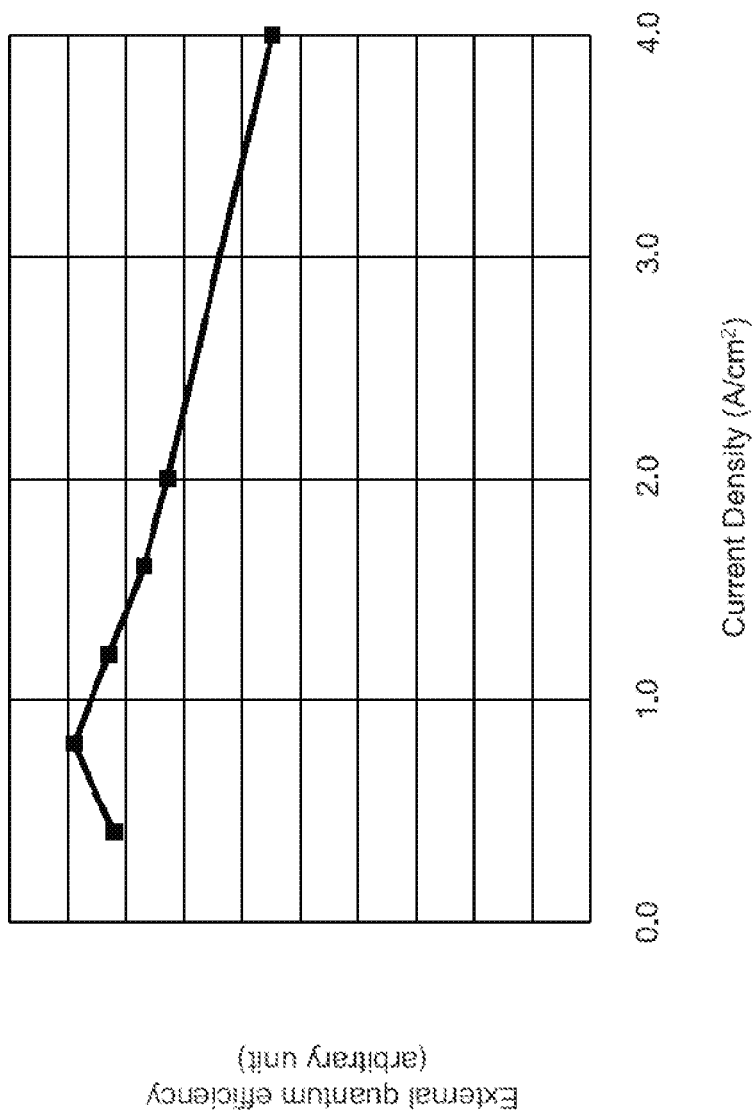
FIG. 5E is a graph showing external quantum efficiency of a light emitting diode as a function of current density.

FIG. 5E illustrates a plot of external quantum efficiency as a function of current density of a micro LED having a lateral dimension in a range from 1 micron to 100 microns described in U.S. Patent Application Publication Number 2018/0114878 A1, published on Apr. 26, 2018 and filed as U.S. application Ser. No. 15/786,766 on Oct. 18, 2017, and incorporated herein by reference in its entirety. As shown in FIG. 5E, the peak external quantum efficiency occurs at low current densities below 1 A/cm$^2$ (e.g., around 0.8 A/cm$^2$).

In one embodiment of the present disclosure, the present inventors realized that the LED can be designed to operate at the current density at which the LED's peak external quantum efficiency occurs by making the area of the interface between the electrically active region 36A of the p-doped semiconductor material layer 36 and the anode contact 50 equal to an area at which the desired LED operating voltage will produce the optimum current density which corresponds to the LED's peak external quantum efficiency. Thus, a method of opening the LED includes applying the operating voltage to the LED to produce the current density in the LED which generates light emission at the peak external quantum efficiency of the LED.

According to an aspect of the present disclosure, to control the area of the interface between the electrically active region 36A of the p-doped semiconductor material layer 36 and the anode contact 50, inactive regions 36S are formed in the p-doped semiconductor material layer 36 on one or more side of the electrically active region 36A. The inactive regions 36S are formed by reducing an electrical conductivity of the p-doped semiconductor material layer 36 adjacent to the electrically active region 36A. The conductivity reduction electrically deactivates the inactive regions 36S. In one embodiment, the electrically active region 36A can have electrical conductivity in a range from $1.0 \times 10^5$ S/m to $1.0 \times 10^7$ S/m, and the inactive region 36S can have electrical conductivity in a range from $1.0 \times 10^{-4}$ S/m to $1.0 \times 10^4$ S/m.

Figure 5F:
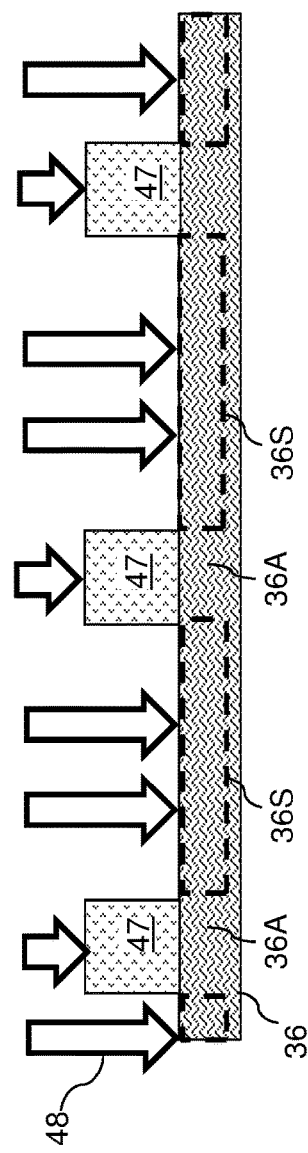
FIG. 5F is a vertical cross-sectional view of an exemplary in-process light emitting diode during a plasma deactivation step according to one embodiment.
Figure 5G:
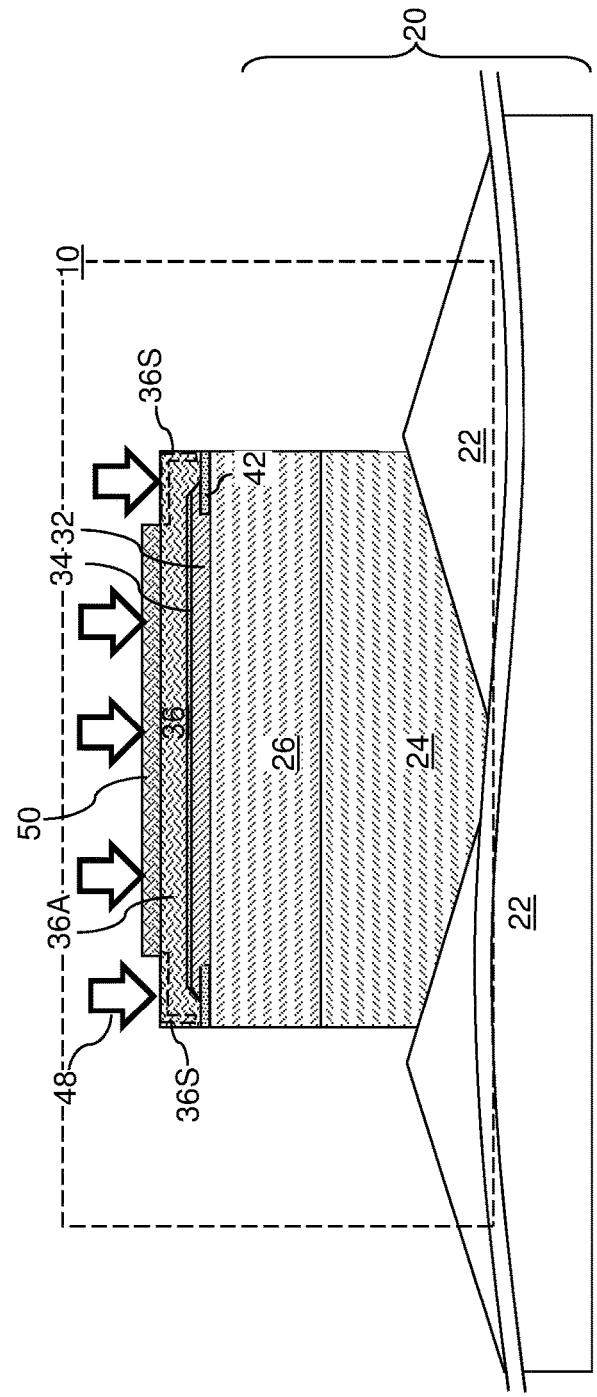
FIG. 5G is a vertical cross-sectional view of an exemplary in-process light emitting diode during a plasma deactivation step according to another embodiment.

In one embodiment, the electrical conductivity of the inactive regions 36S of the p-doped semiconductor material layer 36 is reduced by performing a plasma treatment on the physically exposed surfaces of the inactive regions 36S of the p-doped semiconductor material layer 36, as shown in FIGS. 5F and 5G.

In the embodiment shown in FIG. 5F, a mask (such as a photoresist mask) 47 is formed over the p-doped semiconductor material layer 36 prior to forming the anode contact 50. The mask 48 covers the active regions 36A and exposes the inactive regions 36S. The masked p-doped semiconductor material layer 36 is then exposed to a plasma 48, such as hydrogen plasma, oxygen plasma, or nitrogen plasma to electrically deactivate the exposed active regions 36S of the p-doped semiconductor material layer 36. The mask 47 protects the active regions 36A from the plasma 48 such that the electrical conductivity of the active regions 36A remains the same or is decreased by less than 10% after the plasma 48 treatment. The mask 47 is removed (e.g., by ashing or selective etching) after the plasma 48 treatment. The anode contact 50 is then formed over the active regions 36A and optionally over parts of the inactive regions 36S, as shown in FIGS. 1A to 4D. In this embodiment, the horizontal surface area of the active regions 36A can be less than the horizontal surface area of the anode contact 50. Thus, a relatively large anode contact 50 can be used in this embodiment while still making the area of the interface between the electrically active region 36A and the anode contact 50 equal to an area at which the desired LED operating voltage will produce the current density which corresponds to the micro LED's peak external quantum efficiency. Each area of the interface between an electrically active region 36A and the anode contact 50 may be equal to an area which during LED operation produces a current density in a range from 0.90 times a peak external quantum efficiency of the LED to the peak external quantum efficiency of the LED. The ratio of the total area of the interface between the electrically active region 36A and the anode contact 50 to the total area of the micro LED may be in a range from 0.0001 to 0.25, such as from 0.01 to 0.1. The smaller ratio of the total area of the interface between the electrically active region 36A and the anode contact 50 to the total area of the micro LED has the beneficial effect of providing a sharper image from a display device including an array of micro LEDs.

In an alternative embodiment shown in FIG. 5G, the mask 47 formation is omitted and the plasma 48 treatment occurs after formation of the anode contact 50 (e.g., after the processing steps of FIGS. 1A, 2A, 3A, and 4A or after the processing steps of FIGS. 1C, 2C, 3C, and 4C). In this embodiment, the anode contact 50 and optionally the reflector 70 can be used as a mask during the plasma 48 treatment. The anode contact 50 and/or the reflector 70 covers the active regions 36A and exposes the inactive regions 36S. The partially covered p-doped semiconductor material layer 36 is then exposed to the plasma 48, such as hydrogen plasma, oxygen plasma, or nitrogen plasma to electrically deactivate the exposed active regions 36S of the p-doped semiconductor material layer 36. The anode contact 50 and/or the reflector 70 protects the active regions 36A from the plasma 48 such that the electrical conductivity of the active regions 36A remains the same or is decreased by less than 10% after the plasma 48 treatment. In this embodiment, the horizontal surface area of the active regions 36A is about the same as that of the anode contact 50.

The plasma treatment can be performed in any process chamber configured to generate a plasma of hydrogen, oxygen, or nitrogen. The energy and duration of the plasma can be selected such that each physically exposed surface layer having a thickness of at least 3 nm within the p-doped semiconductor material layer 36 is structurally damaged sufficiently to decrease the electrical conductivity and charge carrier transport along the surface of the inactive regions 36S p-doped semiconductor material layer 36 by at least 50%, such as by 90%, for example by 90 to 99.99% compared to the active regions 36A. In one embodiment, the energy of and duration of the plasma can be selected such that the plasma damage extends over at least 30%, such as at least 50%, such as at least 80%, such as 80 to 100% of the thickness of a planar portion of the inactive region 36S. Thus, electrical current flow through the inactive regions 36S can be decreased, and at least 70%, and/or at least 80%, and/or at least 90%, and/or at least 95% of all electrical current flows through the active regions 36A. The current density through portions of the inactive regions 36S can be less than 80%, and/or less than 60%, and/or less than 40%, and/or less than 20%, of the current density through active regions 36A.

In one embodiment, the plasma-treated inactive regions 36S can have an electrical conductivity less than 30%, such as less than 10% of the active regions 36A, i.e., the regions of the p-doped semiconductor material layer 36 that is protected from the plasma treatment. In one embodiment, the electrical conductivity of the inactive regions 36S can be less than 1%, such as 0.01 to 0.5% of the electrical conductivity of the active regions 36A.

In one embodiment, the ratio of the area of the p-doped semiconductor material layer 36 and to the area of the anode contact 50 is less than 1, and can be in a range from 0.001 to 0.90, such as from 0.001 to 0.01, from 0.01 to 0.05, from 0.05 to 0.2, from 0.2 to 0.5, or from 0.5 to 0.9. At least a portion of the electrically active region 36A underlies the anode contact 50 and at least a portion of the inactive region 36S does not underlie the anode contact 50 (e.g., is not covered by the anode contact 50). In the embodiment of FIG. 5F, the entire electrically active region 36A can underlie the anode contact 50, a first portion of the inactive region 36S underlies the anode contact 50, and a second portion of the inactive region 36S does not underlie the anode contact 50. In the embodiment of FIG. 5G, the entire electrically active region 36A can underlie the anode contact 50 and the entire inactive region 36S does not underlie the anode contact 50.

Each region of plasma damage in the p-doped semiconductor material layer 36 defines an inactive region 36S. In one embodiment, each region of plasma damage to the p-doped semiconductor material layer 36 during the plasma treatment, i.e., each inactive region 36S, can have a lesser thickness than a thickness of the electrically active region, such as the thickness of the portion of the p-doped semiconductor material layer 36 directly underneath the anode contact 50.

In one embodiment, each inactive region 36S can have a crystalline defect density that is at least ten times, such as at least one hundred times, such as ten to 1000 times the crystalline defect density of the active region 36A. In one embodiment, the inactive regions 36S and the active region 36A can include p-type dopant atoms of a same species at a same atomic concentration (e.g., they can comprise portions of the same GaN layer doped with magnesium at the same concentration). In one embodiment, the reflector 70 that is subsequently formed can have a smaller area than the anode contact 50.

Figure 6:
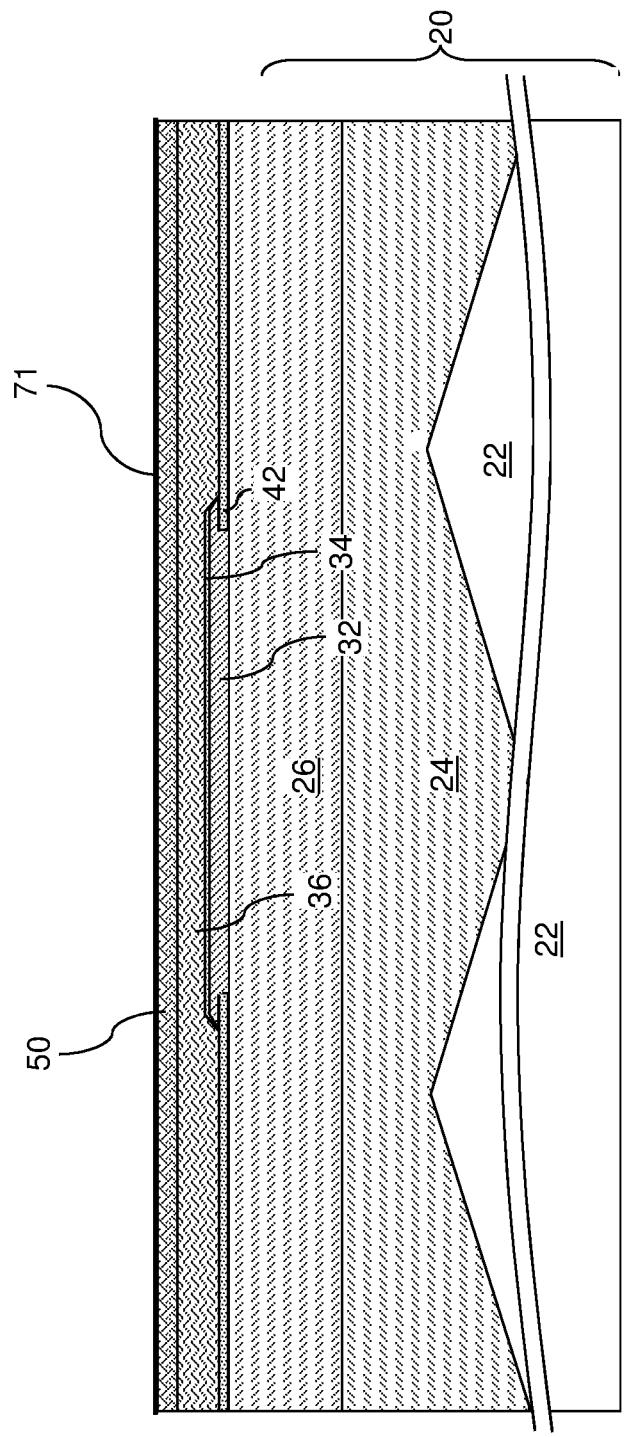
FIG. 6 is a vertical cross-sectional view of an exemplary in-process light emitting diode after deposition of a first metal layer according to an embodiment of the present disclosure.
Figure 7:
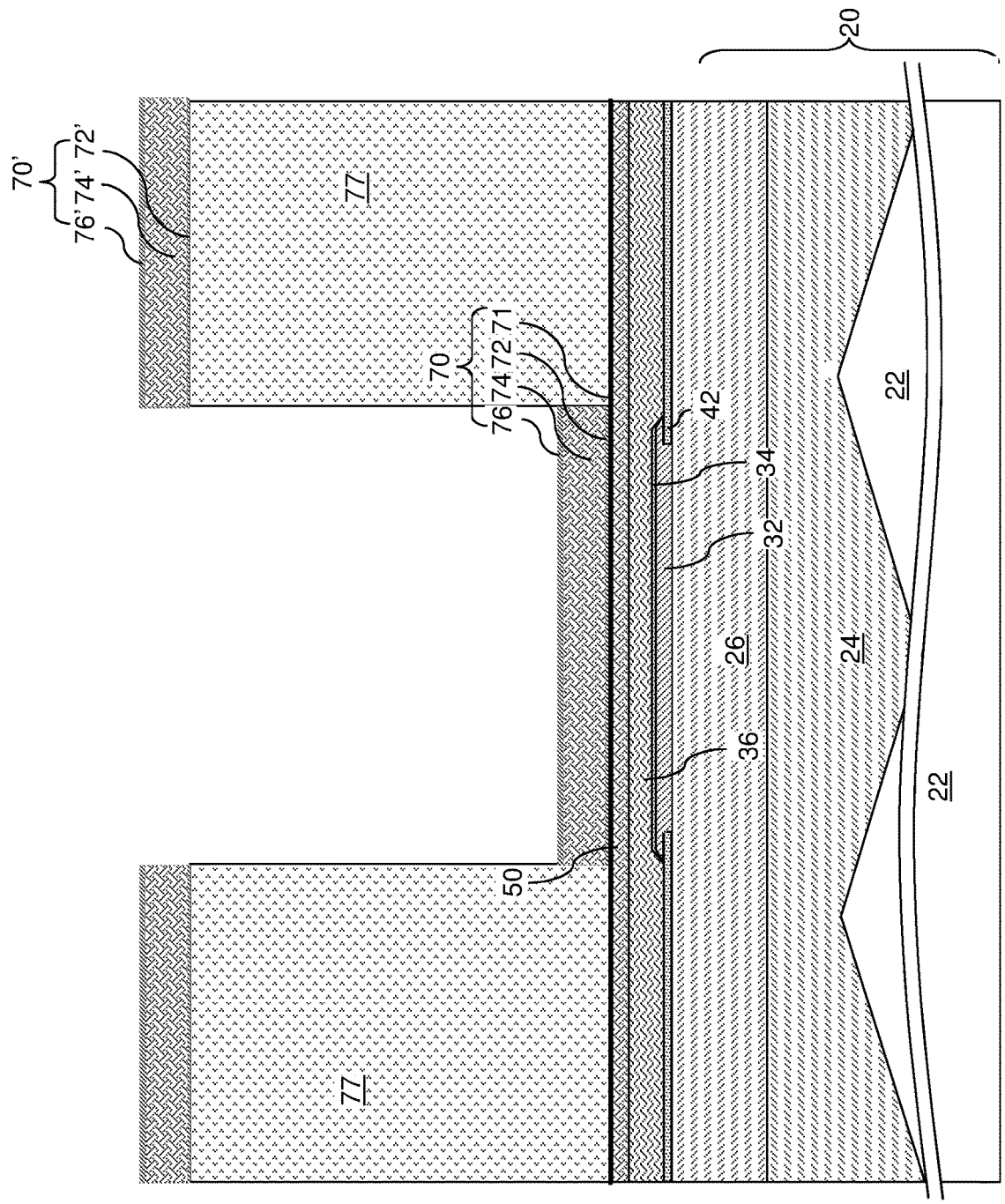
FIG. 7 is a vertical cross-sectional view of an exemplary in-process light emitting diode after formation of a patterned lift-off mask and deposition of a second metal layer, an aluminum layer, and a metallic adhesion layer according to an embodiment of the present disclosure.
Figure 8:
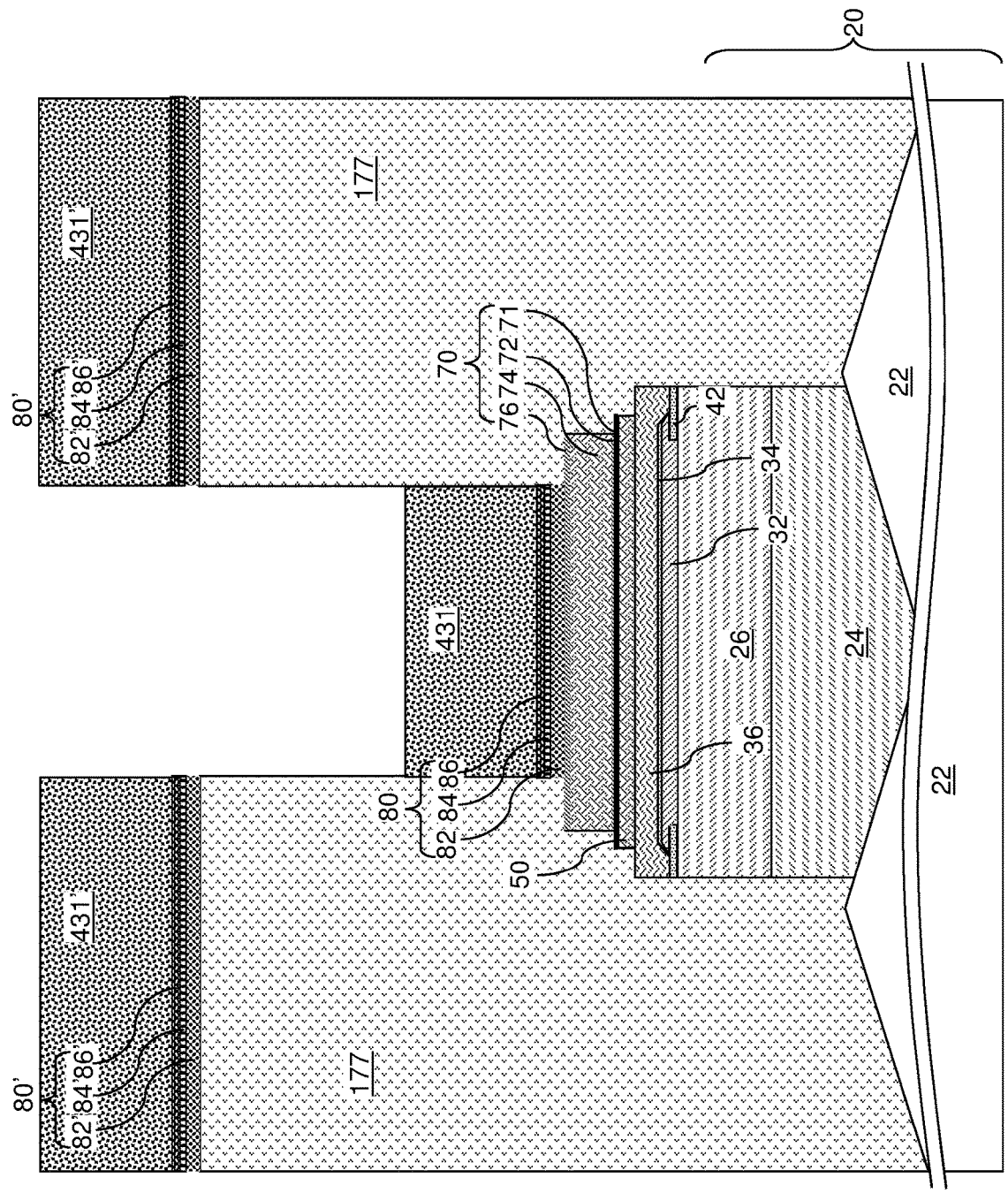
FIG. 8 is a vertical cross-sectional view of an exemplary in-process light emitting diode after lifting off the patterned lift-off mask and deposition of a first metallic bonding pad layer, a platinum layer and tin at an elevated temperature to form a device-side tin solder according to an embodiment of the present disclosure.

FIGS. 6-8 illustrate an embodiment in which the reflector 70 is formed after formation of the anode contact 50 as in the embodiments of FIGS. 1B, 2B, 3B, and 4B. FIGS. 6-8 illustrate processing sequences for an embodiment in which the reflective metal layer 70 is formed as a planar structure that entirely overlies the top surface of an underlying anode contact 50. In such configurations, the entirety of the reflector 70 is more distal from the n-doped compound semiconductor substrate layer 26 than a most distal surface of the n-doped compound semiconductor region 32 is from the n-doped compound semiconductor substrate layer 26 within each light emitting diode 10. The reflector 70 which overlies and is electrically connected to the anode contact 50 can have a smaller area than the anode contact 50.

Figure 9:
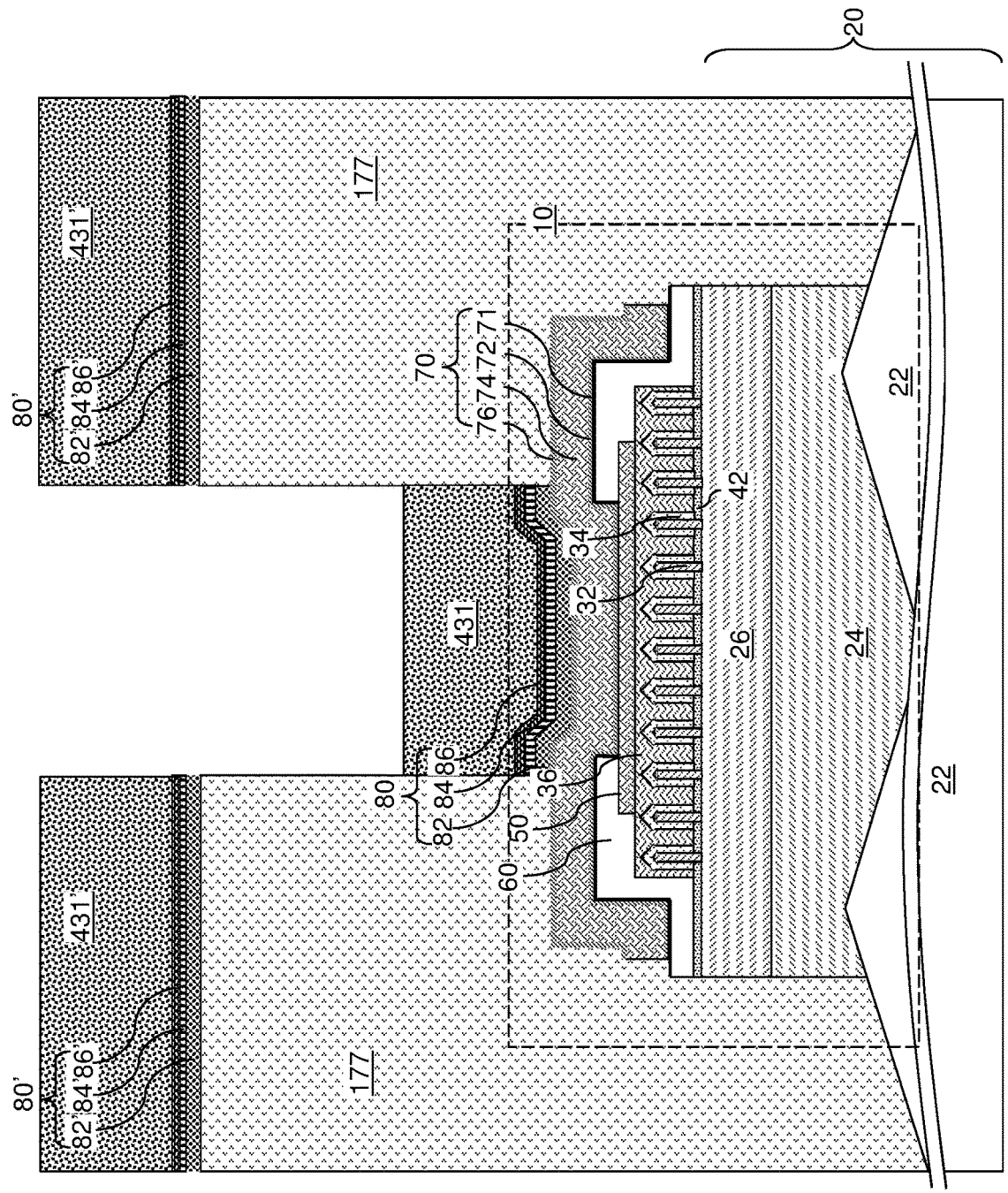
FIG. 9 is a vertical cross-sectional view of another exemplary in-process light emitting diode after deposition of a second metal layer, an aluminum layer, and a metallic adhesion layer, according to an alternative embodiment of the present disclosure.

FIG. 9 illustrates a processing step corresponding to the processing step of FIG. 7 for alternative configurations (such as the configurations of FIGS. 1D, 2D, 3D, and 4D) in which the reflective metal layer 70 is formed with a laterally-extending portion that is more distal from the n-doped compound semiconductor substrate layer 26 than a most distal surface of the p-doped semiconductor material layer 36 (which is in contact with an anode contact 50) is from the n-doped compound semiconductor substrate layer 26, and a sidewall portion adjoined to a periphery of the laterally-extending portion, extending downward therefrom, and laterally surrounding the n-doped compound semiconductor region 32, the n-doped compound semiconductor substrate layer 26, and the single crystalline buffer semiconductor layer 24 of the same light emitting device 10. It is understood that the structural features illustrated in FIGS. 6-9 can be present in each area in which a light emitting diode 10 is subsequently formed.

Referring back to FIG. 6, a first metal layer 71 can be deposited directly on the physically exposed surface of the anode contact 50 and the optional dielectric material layer 60 (if present as shown in FIG. 9). The first metal layer 71 is a component of a reflector 70. The first metal layer 71 includes an adhesion promoting material such as nickel or platinum. In one embodiment, the first metal layer 71 includes nickel. The first metal layer 71 can be deposited by a non-conformal deposition process such as physical vapor deposition (PVD) or vacuum evaporation, or by a conformal deposition process such as chemical vapor deposition (CVD). The first metal layer 71 can have a first thickness in a range from 0.3 nm to 10 nm, such as from 0.6 nm to 4 nm, although lesser and greater thicknesses can also be employed.

As shown in FIGS. 7 and 9 patterned lift-off mask 77 can be formed over the first metal layer 71. The patterned lift-off mask 77 can be a patterned photoresist layer. In one embodiment, the patterned lift-off mask 77 can be formed by applying and lithographically patterning a photoresist layer with an array of openings such that each opening through the photoresist layer is entirely within a periphery of an underlying anode contact 50 as illustrated in FIG. 7.

Referring to FIGS. 7 and 9, a second metal layer 72 having the same composition as the first metal layer 71 can be subsequently anisotropically deposited, for example, by physical vapor deposition (PVD) or vacuum evaporation on the first metal layer 71 and over the patterned lift-off mask 77. The second metal layer 72 can be formed directly on the top surface of the first metal layer 71. An additional second metal layer 72' can be formed on the top surface of the patterned lift-off mask 77. The second metal layer 72 and the additional second metal layer 72' can be formed on the physically exposed surface of the first metal layer 71 and over the patterned lift-off mask 77 around each area of the light emitting diodes 10. The second metal layer 72 includes the same metal as the first metal layer 71 to maximize adhesion strength between the first metal layer 71 and the second metal layer 72. In one embodiment, the first metal layer 71 and the second metal layer 72 include an elemental metal such as nickel or platinum. The thickness of the second metal layer 72 over horizontal surfaces can be in a range from 0.3 nm to 40 nm, such as from 0.4 nm to 6 nm, although lesser and greater thicknesses can also be employed.

Around each area of a light emitting diode 10, a combination of the first metal layer 71 and the second metal layer 72 is deposited within a center region of the light emitting diode 10, while only the first metal layer 71 is deposited in a peripheral region, which is located outside a periphery of the center region. The center region may be entirely within the area defined by the periphery of an anode contact 50. The peripheral region can have an inner periphery that coincides with a periphery of the center region. Specifically, the inner periphery of the peripheral region can coincide with the sidewalls of the patterned lift-off mask 77.

The combination of the first metal layer 71 and the second metal layer 72 constitutes a single metal layer having two different thicknesses. Specifically, the combination of the first metal layer 71 and the second metal layer 72 constitutes a dual thickness metal adhesion layer (71, 72) having a first thickness at a peripheral region (i.e., the region in which only the first metal layer 71 is deposited) and having a second thickness that is greater than the first thickness at a center region (i.e., the region in which both the first metal layer 71 and the second metal layer 72 are deposited). In one embodiment, the first thickness is in a range from 0.3 nm to 10 nm, and the second thickness in a range from 0.6 nm to 50 nm. In another embodiment, the first thickness is in a range from 0.6 nm to 4 nm, and the second thickness in a range from 1 nm to 10 nm.

Aluminum can be deposited by an anisotropic deposition method (such as sputtering or vacuum evaporation). An aluminum layer 74 can be formed directly on the dual thickness metal adhesion layer (71, 72) over the anode contact 50, and an additional aluminum layer 74' can be formed on the additional second metal layer 72' over the patterned lift-off mask 77. The aluminum layer 74 can consist essentially of aluminum. The aluminum layer 74 provides malleability during subsequent laser processing process, such as laser ablation processes and laser solder processes, so that active regions 34 of the light emitting devices 10 are protected from mechanical shock and/or structural damage. A metal having a higher malleability, such as gold or silver, may also be used in lieu of aluminum. Horizontal portions of the aluminum layer 74 can have a thickness in a range from 500 nm to 3,000 nm, such as from 800 nm to 2,000 nm, over the dual thickness metal adhesion layer (71, 72).

A metallic adhesion material can be deposited over the aluminum layer 74 by an anisotropic deposition process such as physical vapor deposition or vacuum evaporation. The metallic adhesion material can include an elemental metal such as nickel or platinum. A metallic adhesion layer 76 is formed on the top surface of the aluminum layer 74 overlying the anode contact 50, and an additional metallic adhesion layer 76' is formed on the additional aluminum layer 74' over the patterned lift-off mask 77. Horizontal portions of the metallic adhesion layer 76 can have a uniform thickness, which can be in a range from 1 nm to 300 nm, such as from 10 nm to 100 nm, although lesser and greater thicknesses can also be employed. The stack of the dual thickness metal adhesion layer (71, 72), the aluminum layer 74, and the metallic adhesion layer 76 constitutes a reflector 70, which can function as a reflector and a portion of an anode of the light emitting device 10. The stack of the additional metallic adhesion layer 76', the additional aluminum layer 74', and the additional second metal layer 72' constitute an additional reflector 70'.

Referring to FIG. 8, the patterned lift-off mask 77 and material layers thereupon (such as the additional reflector 70') can be removed employing a lift-off process. For example, the exemplary structure can be immersed in a solvent that dissolves the material of the patterned lift-off mask 77. A suitable clean process can be performed to remove residual materials of the additional reflector 70'.

A photoresist layer (not shown) can be applied over the exemplary structure and lithographically patterned to cover each area of the light emitting diodes 10. The patterned areas of the photoresist layer can be arranged as a two-dimensional array with channels (corresponding to areas from which the material of the photoresist layer is removed during development) laterally surrounding each area of the light emitting diodes 10. An anisotropic etch process is performed to pattern the anode contact 50, the p-doped semiconductor material layer 36, the active regions 34, the n-doped compound semiconductor regions 32, the growth mask layer 42 (if present), the n-doped compound semiconductor substrate layer 26, and the single crystalline buffer semiconductor layer 24. The anisotropic etch process can stop on the support substrate 22.

In the embodiments shown in FIGS. 1A, 2A, 3A and 4A, the areas of the openings in the photoresist layer extend beyond the entire respective areas of the underlying patterned reflector 70. Thus, the reflector 70 which is patterned in the prior lift-off step is not etched during above etching step. This avoids the relatively difficult metal etch. In these embodiments, the reflector 70 which has a smaller area than the anode contact 50.

Alternatively, in the embodiments shown in FIGS. 1C, 2C, 3C and 4C, the metal reflector 70 is also etched during the above etching step. In these embodiments, the metal etch is performed to form the metal reflector 70 that extends partially over the sidewalls of the LEDs 10 to improve the reflection of the light emitted by the LEDs 10. After etching, the photoresist layer can be removed, for example, by ashing.

Each etched mesa comprising a contiguous set of patterned portions of the reflector 70, anode contact 50, the p-doped semiconductor material layer 36, the active regions 34, the n-doped compound semiconductor regions 32, the growth mask layer 42 (if present), the n-doped compound semiconductor substrate layer 26, and the single crystalline buffer semiconductor layer 24 constitute components of a respective light emitting diode 10. An optional dielectric layer, such as silicon oxide or silicon nitride, can be deposited over the sidewalls of the etched mesa while exposing the top surface of the reflector 70. In case the n-doped compound semiconductor substrate layer 26 and the single crystalline buffer semiconductor layer 24 are patterned as discrete material portions prior to formation of the n-doped compound semiconductor regions 32 (as in the case of the alternative configurations of FIGS. 4A and 4C), the above patterning step may be optionally omitted. In this case, thin material layers having the same material compositions as the active regions 34 and the n-doped compound semiconductor regions 32 can be formed on the sidewalls of the patterned portions of the n-doped compound semiconductor substrate layer 26 and the single crystalline buffer semiconductor layer 24, and the p-doped semiconductor material layer 36 can extend to sidewalls of such thin material layers at the periphery of each light emitting diode 10.

As shown in FIGS. 8 and 9 a second patterned lift-off mask 177 can be formed over the first metal layer 71. The second patterned lift-off mask 177 can be a patterned photoresist layer. In one embodiment, the second patterned lift-off mask 177 can be formed by applying and lithographically patterning a photoresist layer with an array of openings. Subsequently, material layers for forming a device-side bonding pad can be deposited. For example, a first metallic bonding pad metal can be anisotropically deposited to form a first metallic bonding pad layer 82 and a first metallic material layer 82'. The first metallic bonding pad layer 82 can be deposited directly on the metallic adhesion layer 76 overlying the anode contact 50 and the reflector 70, and the first metallic material layer 82' can be deposited on a top surface of the second patterned lift-off mask 177. The first metallic bonding pad layer 82 and the first metallic material layer 82' can include a transition metal such as titanium or tantalum. In one embodiment, the first metallic bonding pad layer 82 and the first metallic material layer 82' can consist essentially of titanium or tantalum. Horizontal portions of the first metallic bonding pad layer 82 and the first metallic material layer 82' can have a thickness in a range from 30 nm to 300 nm, such as from 60 nm to 200 nm, although lesser and greater thicknesses can also be employed. The first metallic bonding pad layer 82 is electrically connected to the anode contact 50 through the reflector 70.

A second metallic bonding pad metal can be anisotropically deposited to form a second metallic bonding pad layer 84 and a second metallic material layer 84'. The second metallic bonding pad layer 84 can be deposited directly on the first metallic bonding pad layer 82 overlying the anode contact 50 and the reflector 70, and the second metallic material layer 84' can be deposited on a top surface of the first metallic material layer 82' over the patterned lift-off mask 77. The second metallic bonding pad layer 84 and the second metallic material layer 84' can include an adhesion promoting metal having a melting temperature greater than 1,500 degrees Celsius. In one embodiment, the second metallic bonding pad layer 84 and the second metallic material layer 84' can consist essentially of platinum. Horizontal portions of the second metallic bonding pad layer 84 and the second metallic material layer 84' can have a thickness in a range from 50 nm to 500 nm, such as from 100 nm to 250 nm, although lesser and greater thicknesses can also be employed.

The exemplary structure is placed in an environment having an elevated temperature, which can be in a range from 100 degrees Celsius to 230 degrees Celsius (i.e., below the tin melting point), such as from 120 degrees Celsius to 200 degrees Celsius. Tin is deposited within each area inside an outer periphery of a topmost surface of the second metallic bonding pad layer 84 and on the second metallic material layer 84' at the elevated temperature. Either pure tin (containing only unavoidable impurities) or tin containing less than 1 atomic percent (e.g., 0.5 atomic percent or less) of silver and/or copper as a dendrite prevention element is deposited in this step. Tin is a high temperature solder material, and provides a controlled reflow during a laser solder process that is subsequently employed. The elevated temperature during deposition of tin induces diffusion of tin into the second metallic bonding pad layer 84 during the deposition of tin onto the second metallic bonding pad layer 84.

A third metallic bonding pad layer 86 and a third metallic material layer 86' comprising an alloy (e.g., intermetallic) of platinum and tin is formed in upper regions of the respective second metallic bonding pad layer 84 and the second metallic material layer 84' into which tin diffuses. The third metallic bonding pad layer 86 may contain between 60 and 80 weight percent tin and 20 to 40 weight percent platinum. The remaining lower portion of the second metallic bonding pad layer 84 includes tin at an atomic concentration less than 0.5% in atomic concentration, and is considered to be the remaining second metallic bonding pad layer 84. Thus, the second metallic bonding pad layer 84 can include surface portions including tin at an atomic concentration less than 0.5%, and can include a portion that consists essentially of platinum. The entire volume of the second metallic bonding pad layer 84 includes platinum at an atomic concentration of at least 99%, such as at least 99.5%. The unreacted portion of the deposited tin forms a tin portion 431. The tin portion 431 can include tin at an atomic concentration of at least 99%, such as at least 99.5% and may optionally include 0.5 atomic percent of silver and/or copper.

The thickness of the tin portion 431 can be in a range from 1 micron to 10 microns, such as from 1.5 micron to 4 microns. The first metallic bonding pad layer 82, the second metallic bonding pad layer 84, and the third metallic bonding pad layer 86 collectively constitute a device-side bonding pad 80. The thickness of the third metallic bonding pad layer 86 can be less than the thickness of the second metallic bonding pad layer 84. For example, the thickness of the second metallic bonding pad layer 84 can be in a range from 50 nm to 500 nm, such as from 100 nm to 250 nm. The thickness of the third metallic bonding pad layer 86 can be in a range from 40 nm to 400 nm, such as from 80 nm to 200 nm. Each region of the tin portion 431 includes tin at an atomic concentration of at least 99%. Regions of the tin portion 431 that are spaced from the device-side bonding pad 80 by more than 200 nm can consist essentially of tin. The tin to platinum volume ratio in the device-side bonding pad 80 can be at least 30:1, such as at least 50:1, for example 100:1 to 30:1. The stack of the third metallic material layer 86', the second metallic material layer 84' and the first metallic material layer 82' constitutes a metallic material layer stack 80'.

Referring back to FIGS. 1A and 3B, the second patterned lift-off mask 177 and material layers thereupon (such as the a metallic material layer stack 80') can be removed employing a lift-off process. For example, the exemplary structure can be immersed in a solvent that dissolves the material of the second patterned lift-off mask 177. A suitable clean process can be performed to remove residual materials of the metallic material layer stack 80'.

In one embodiment, the first metallic bonding pad layer 82 can consist essentially of titanium, and the second metallic bonding pad layer 84 can consist essentially of platinum. In one embodiment, the first metallic bonding pad layer 82 can have a thickness in a range from 30 nm to 300 nm, the thinned portion of the second metallic bonding pad layer 84 can have a thickness in a range from 10 nm to 200 nm, the third metallic bonding pad layer 86 can have a thickness in a range from 40 nm to 400 nm within areas in which the tin portion 431 contacts the third metallic bonding pad layer 84, and the tin portion 431 can have a thickness in a range from 1 micron to 10 microns.

A direct view display device can be formed by transferring the light emitting diodes 10 of FIGS. 1A, 1B, 2A, 2B, 3A, 3B, 4A, and/or 4B to a backplane. The process of forming a backplane-side bonding pad 421 is illustrated in FIGS. 10A and 10B.

Figure 10A:
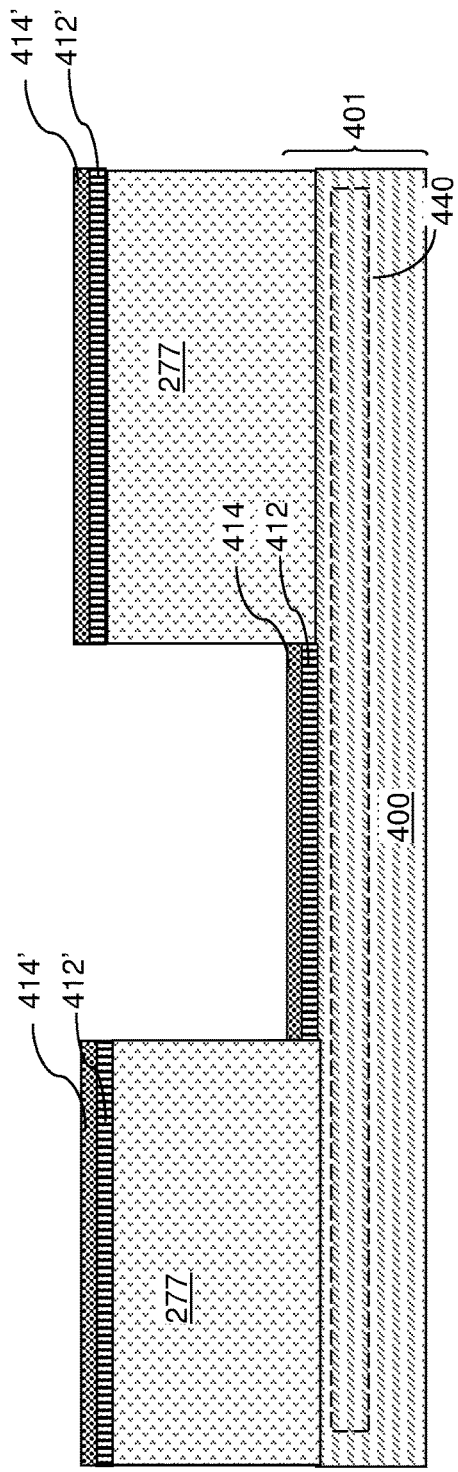
FIG. 10A is a vertical cross-sectional view of a backplane during formation of a backplane-side bonding pad according to an embodiment of the present disclosure.
Figure 10B:
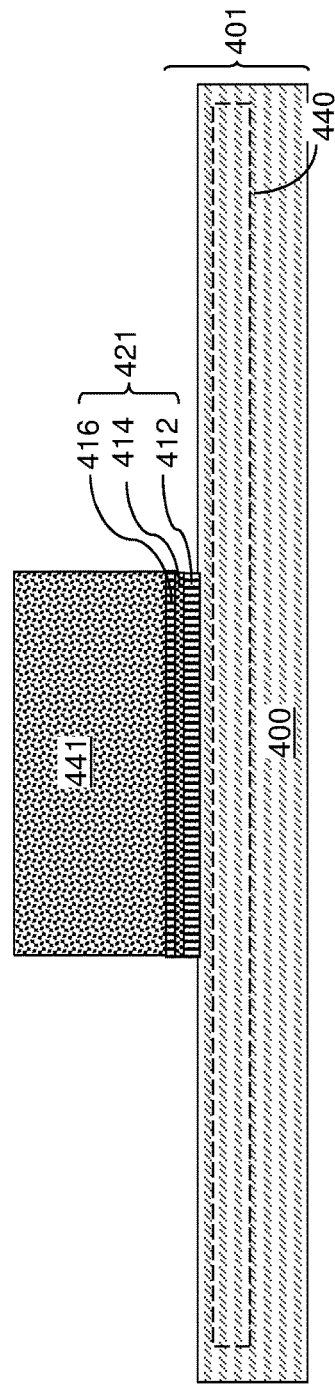
FIG. 10B is a vertical cross-sectional view of the backplane after deposition of tin to form a backplane-side tin solder according to an embodiment of the present disclosure.

Referring to FIG. 10A, a backplane 401 is illustrated during formation of backplane-side bonding pads 421. While only a single backplane-side bonding pad 421 is illustrated herein, it is understood that an array of backplane-side bonding pads 421 is formed on a front surface of the backplane 401 to form a direct view display device. The backplane 401 includes a backplane substrate 400 within a backplane driver circuitry 440 embedded therein. As used herein, a "backplane substrate" refers to any substrate configured to affix multiple devices thereupon. The backplane driver circuitry 440 may include an array of active devices (such as field effect transistors) and/or metal interconnect structures. The metal interconnect structures can provide electrical connection between the backplane-side bonding pads 421 and the active devices and/or between the backplane-side bonding pads 421 and an input/output port of the backplane 401.

Generally, the same set of processing steps employed to form device-side bonding pads 80 can be employed to form an array of backplane-side bonding pads 421 on the front side of the backplane substrate 400. For example, a lift-off mask 277 can be formed on the top surface of the backplane substrate 400 by depositing and patterning a photoresist layer. The photoresist layer can be patterned to form openings in regions in which a backplane-side bonding pad 421 is to be subsequently formed. Material layers for forming backplane-side bonding pads 421 can be deposited. For example, a first backplane-side bonding pad metal can be anisotropically deposited to form a first backplane-side bonding pad layer 412 and a first metallic material layer 412'. The first backplane-side bonding pad layer 412 can be deposited directly on the physically exposed portions of the top surface of the backplane substrate 400, and the first metallic material layer 412' can be deposited on a top surface of the patterned lift-off mask 277. The first backplane-side bonding pad layer 412 and the first metallic material layer 412' can include a transition metal such as titanium or tantalum. In one embodiment, the first backplane-side bonding pad layer 412 and the first metallic material layer 412' can consist essentially of titanium or tantalum. Horizontal portions of the first backplane-side bonding pad layer 412 and the first metallic material layer 412' can have a thickness in a range from 30 nm to 300 nm, such as from 60 nm to 200 nm, although lesser and greater thicknesses can also be employed. The first backplane-side bonding pad layer 412 is electrically connected to the anode contact 50.

A second backplane-side bonding pad metal can be anisotropically deposited to form a second backplane-side bonding pad layer 414 and a second metallic material layer 414'. The second backplane-side bonding pad layer 414 can be deposited directly on the first backplane-side bonding pad layer 412, and the second metallic material layer 414' can be deposited on a top surface of the first metallic material layer 412' over the patterned lift-off mask 277. The second backplane-side bonding pad layer 414 and the second metallic material layer 414' can include an adhesion promoting metal having a melting temperature greater than 1,500 degrees Celsius. In one embodiment, the second backplane-side bonding pad layer 414 and the second metallic material layer 414' can consist essentially of platinum. The second backplane-side bonding pad layer 414 and the second metallic material layer 414' can have a thickness in a range from 50 nm to 500 nm, such as from 100 nm to 250 nm, although lesser and greater thicknesses can also be employed.

The backplane 401 can be subsequently placed in an environment having an elevated temperature, which can be in a range from 100 degrees Celsius to 230 degrees Celsius, such as from 120 degrees Celsius to 200 degrees Celsius. Either pure tin or tin containing less than 1 atomic percent Ag and/or Cu can be deposited. Tin is deposited within each area inside an outer periphery of a topmost surface of the second backplane-side bonding pad layer 414 at the elevated temperature. Tin is a high temperature solder material, and reduces reflow during a laser solder process that is subsequently employed. The elevated temperature during deposition of tin induces diffusion of tin into the second backplane-side bonding pad layer 414 during the deposition of tin onto the second backplane-side bonding pad layer 414.

A third backplane-side bonding pad layer 416 comprising an alloy (e.g., intermetallic) of platinum and tin is formed in an upper region of the second backplane-side bonding pad layer 414 into tin diffuses. The third backplane-side bonding pad layer 416 may contain between 60 and 80 weight percent tin and 20 to 40 weight percent platinum. The remaining lower portion of the second backplane-side bonding pad layer 414 includes tin at an atomic concentration less than 0.5% in atomic concentration, and is considered to be the remaining second backplane-side bonding pad layer 414. Thus, the second backplane-side bonding pad layer 414 can include surface portions including tin at an atomic concentration less than 0.5%, and can include a portion that consists essentially of platinum. The entire volume of the second backplane-side bonding pad layer 414 includes platinum at an atomic concentration of at least 99%, such as at least 99.5%. The unreacted portion of the deposited tin forms a backplane-side tin portion 441 and a sacrificial tin portion on the patterned lift-off mask 277. The tin portion 441 can include tin at an atomic concentration of at least 99%, such as at least 99.5% and may optionally include 0.5 atomic percent of silver and/or copper.

Referring to FIG. 10B, the patterned lift-off mask 277 and material layers thereupon (such as the second metallic material layer 414', the first metallic material layer 412' and the sacrificial tin portion) can be removed employing a lift-off process. For example, the backplane 401 and the patterned lift-off mask 277 can be immersed in a solvent that dissolves the material of the patterned lift-off mask 277. A suitable clean process can be performed to remove residual materials from the second metallic material layer 414' and the first metallic material layer 412'.

The first backplane-side bonding pad layer 412, the second backplane-side bonding pad layer 414, and the third backplane-side bonding pad layer 416 collectively constitute a backplane-side bonding pad 421. Each region of the backplane-side tin portion 441 includes tin at an atomic concentration of at least 99%. Regions of the backplane-side tin portion 441 that are spaced from the backplane-side bonding pad 421 by more than 200 nm can consist essentially of tin. The tin to platinum volume ratio in the combination of the backplane-side bonding pad 421 and the backplane-side tin portion 441 can be at least 30:1, such as at least 50:1, for example 100:1 to 30:1.

In one embodiment, the first backplane-side bonding pad layer 412 can consist essentially of titanium, and the second backplane-side bonding pad layer 414 can consist essentially of platinum. In one embodiment, the first backplane-side bonding pad layer 412 can have a thickness in a range from 30 nm to 300 nm, the thinned portion of the second backplane-side bonding pad layer 414 can have a thickness in a range from 10 nm to 200 nm, the third backplane-side bonding pad layer 416 can have a thickness in a range from 40 nm to 400 nm within areas in which the tin portion 431 contacts the third backplane-side bonding pad layer 416, and the backplane-side tin portion 441 can have a thickness in a range from 1 micron to 10 microns, such as 1.5 to 4 microns.

Multiple instances of a structure including a light emitting diode 10 and a tin portion 431 bonded thereto (as illustrated in FIGS. 1A, 1B, 2A, 2B, 3A, 3B, 4A, and 4B) can be transferred to, and bonded onto, the structure including the backplane 40 and the array of backplane-side tin portions 441 illustrated in FIG. 10B. Each instance of a light emitting diode 10 and a tin portion 431 bonded thereto can be bonded to the backplane 401 in an array configuration. Each instance of the bonded structure can comprise a subpixel of the direct view display device. The array of backplane-side bonding pads 421 can include a respective stack of a titanium layer (as embodied as the first backplane-side bonding pad layer 412), a platinum layer (as embodied as the second backplane-side bonding pad layer 414), and a platinum-tin alloy layer (as embodied as the third backplane-side bonding pad layer 416) located on a backplane substrate 400. Upon laser bonding, a vertically neighboring pair of a tin portion 431 and a backplane-side tin portion 441 can be reflowed to a continuous tin portion, which can be a portion of an instance of a structure that is bonded to the backplane substrate 400 through a respective backplane-side bonding pad 421 that includes a respective platinum-tin alloy layer, i.e., the third backplane-side bonding pad layer 416.

FIGS. 11A-11J illustrate an exemplary transfer process that can be employed to attach light emitting diodes 10 in the structures of FIGS. 1A, 1B, 2A, 2B, 3A, 3B, 4A, and/or 4B to the backplane 401 illustrated in FIG. 10B. In one embodiment, each light emitting diode 10 in the structures of FIGS. 1A, 1B, 2A, 2B, 3A, 3B, 4A, and/or 4B can be a subpixel that emits light of a given color, which may be, for example, blue, green, or red. In an illustrative example, the first light emitting diodes 10B can be blue-light emitting diodes, second light emitting diodes 10G can be green-light emitting diodes, and third light emitting diodes 10R can be red-light emitting diodes, although each of the first, second, and third light emitting diodes (10B, 10G, 10R) can be diodes emitting any different color.

Figure 11A:
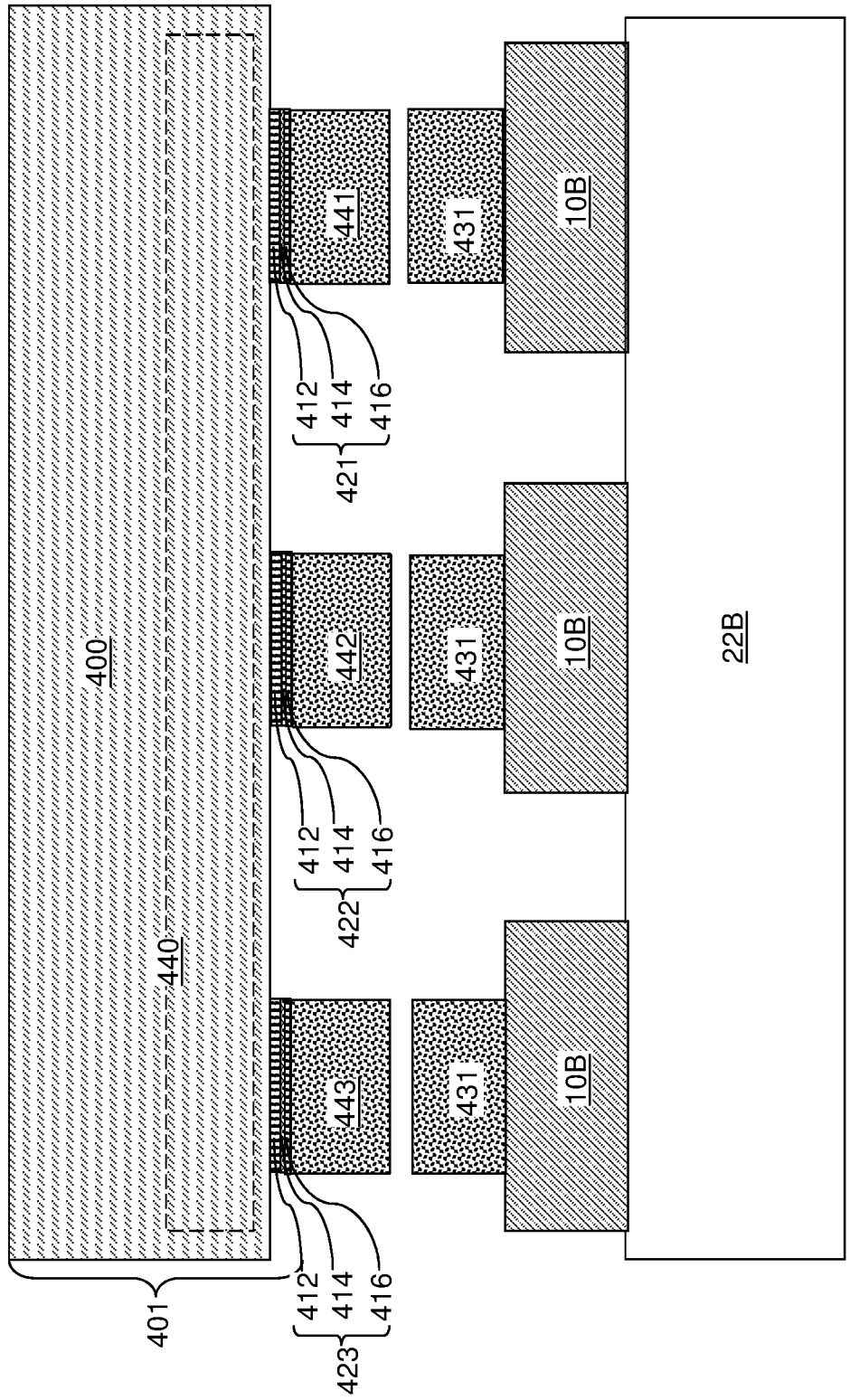
FIGS. 11A-11J are sequential vertical cross-sectional views of an exemplary structure during transfer of light emitting devices to a backplane according to an embodiment of the present disclosure.

Referring to FIG. 11A, an in-process structure is illustrated, which can be employed to form an exemplary light emitting device assembly (e.g., direct view display) according to an embodiment of the present disclosure. In this embodiment, the backplane substrate 400 may have a substantially planar top surface. Backplane-side bonding pads (421, 422, 423) are provided on the top surface of the backplane substrate 400. The backplane-side bonding pads (421, 422, 423) can include different types of backplane-side bonding pads (421, 422, 423) that are employed to bond different types of light emitting diodes 10. For example, the backplane-side bonding pads (421, 422, 423) can include first-type backplane-side bonding pads 421 that are employed to bond a respective first light emitting diode 10B, second-type backplane-side bonding pads 422 that are employed to bond a respective second light emitting diode 10G, and third-type backplane-side bonding pads 423 that are employed to bond a respective third light emitting diode 10R. A backplane-side tin portion (441, 442, 443) can be provided on each of the backplane-side bonding pads (421, 422, 423) employing the methods illustrated in FIGS. 10A and 10B. The backplane-side tin portions (441, 442, 443) can include first-type backplane-side tin portions 441 that are employed to bond a respective first light emitting diode 10B, second-type backplane-side tin portions 442 that are employed to bond a respective second light emitting diode 10G, and third-type backplane-side tin portions 443 that are employed to bond a respective third light emitting diode 10R.

Each backplane-side bonding pads (421, 422, 423) can have the same structure as the backplane-side bonding pad 421 illustrated in FIG. 10B. First tin portions 431 can be formed on the light emitting diodes 10 as described above. A selected subset of the first light emitting diodes 10B can be the first devices to be transferred to the backplane substrate 400. The first light emitting diodes 10B can be located on first support substrate 22B, which is the support substrate 22 on which the first light emitting devices 10B are provided.

The backplane 401 and the assembly including the first support substrate 22B and the first light emitting diodes 10B are positioned such that each tin portion 431 faces a respective one of the backplane-side bonding pads (421, 422, 423). In one embodiment, the opposing pairs of a tin portion 431 and a backplane-side tin portion (441, 442, 443) are placed in physical contact with each other.

Figure 11B:
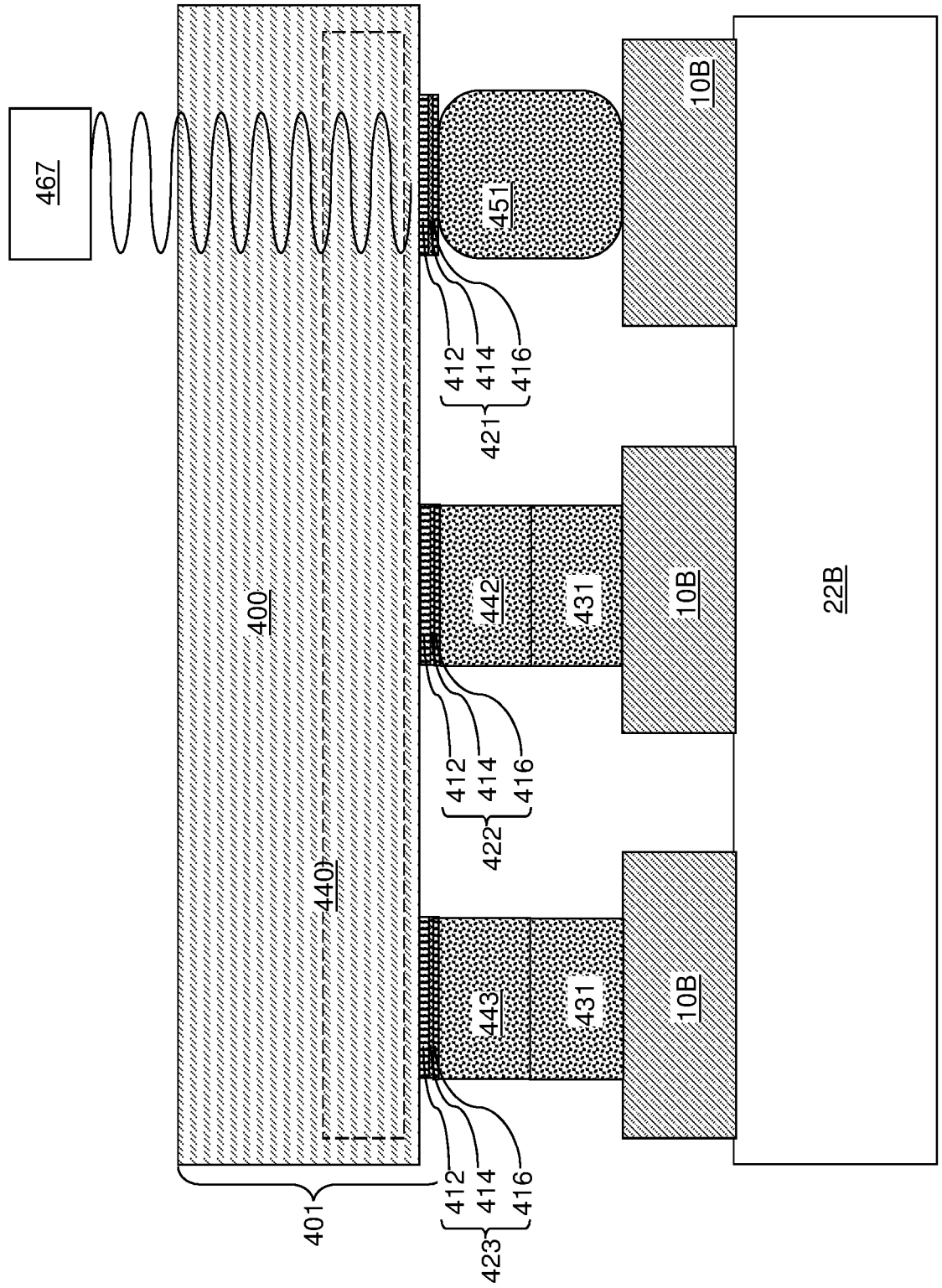

Referring to FIG. 11B, a heating laser 467 can be employed to reflow selected opposing pairs of a tin portion 431 and a backplane-side tin portion 441. The heating laser 467 can have a wavelength that induces greater absorption of energy within the materials of the irradiated pairs of a tin portion 431 and a backplane-side tin portion 441 than within the materials of the support substrate 22 or within the materials of the devices to be transferred (e.g., the first light emitting diodes 10B). The heating laser 467 can have a wavelength in a range from 0.8 micron to 20 microns, such as 1 to 2 microns.

In one embodiment, the assembly of the backplane 401 and the backplane-side tin portions (441, 442, 443) can overlie the assembly of the first support substrate 22B and the first light emitting diodes 10B, and the heating laser 467 be irradiated on the assembly through backplane 401. A laser beam from the heating laser 467 propagate through the backplane 401 onto the backside of a selected backplane-side bonding pad 421, and heat and reflow the underlying backplane-side tin portion 441 and the underlying tin portion 431 to form a soldered (i.e., bonded) tin portion 451.

The backplane driver circuitry 440 (including the metal interconnect structures embedded in the backplane substrate 400) can be configured to provide openings over each backplane-side bonding pad (421, 422, 423) so that collateral heating of the metal interconnect structures inside the backplane substrate 400 can be minimized.

Alternatively, the assembly of the first support substrate 22B and the first light emitting diodes 10B can overlie the backplane 401. In this case, the laser beam may be transmitted through the first support substrate 22B and irradiate the reflector material layer 70 of an irradiated first light emitting diode 10B, which absorbs the laser beam and heats an underlying pair of a tin portion 431 and the underlying backplane-side tin portion 441 for selective heating and reflow to form a soldered (i.e., bonded) tin portion 451.

A soldered tin portion 451 may be formed from the reflowed materials of each heated and reflowed pair of a tin portion 431 and a backplane-side tin portion 441 from either method of laser irradiation. A third metallic bonding pad layer 86 and a third backplane-side bonding pad layer 416 that are bonded to the soldered tin portion 451 provide adhesion of the soldered tin portion 451 to an underlying backplane-side bonding pad 421 and an overlying device-side bonding pad 80 through gradual increase in the platinum concentration for each bonded first light emitting diode 10B.

The duration of the laser irradiation that induces the reflow of a vertical stack of a tin portion 431 and a backplane-side tin portion 441 can be less than 1 second, and may be less than 0.1 second, and/or less than 0.01 second, and/or less than 0.001 second. Thus, the irradiation process functions as a flash anneal. Such a short reflow time is generally insufficient for intermetallic formation. Further, the stack of a tin portion 431 and a backplane-side tin portion 441 consists of tin and optionally a small amount of platinum, silver or cupper (less than 0.5% in atomic concentration), and as such complex intermetallic formation is avoided. Thus, the soldered tin portions 451 can provide good adhesion without formation of complex intermetallic compounds in the solder material, which prevents formation of composition gradients of constituent metals within the center region of each soldered tin portion 451. The center region (occupying more than 99% in volume) of each soldered tin portion 451 can consist of tin (i.e., pure tin with unavoidable impurities) or tin containing 0.5 atomic percent or less of silver and/or copper as an anti-dendrite agent. Each soldered tin portion 451 can be relatively thin (e.g., 10 microns or less in thickness, such as 3 to 7 microns in thickness) due to its purity and provide a good planarity due to its softness.

Figure 11C:
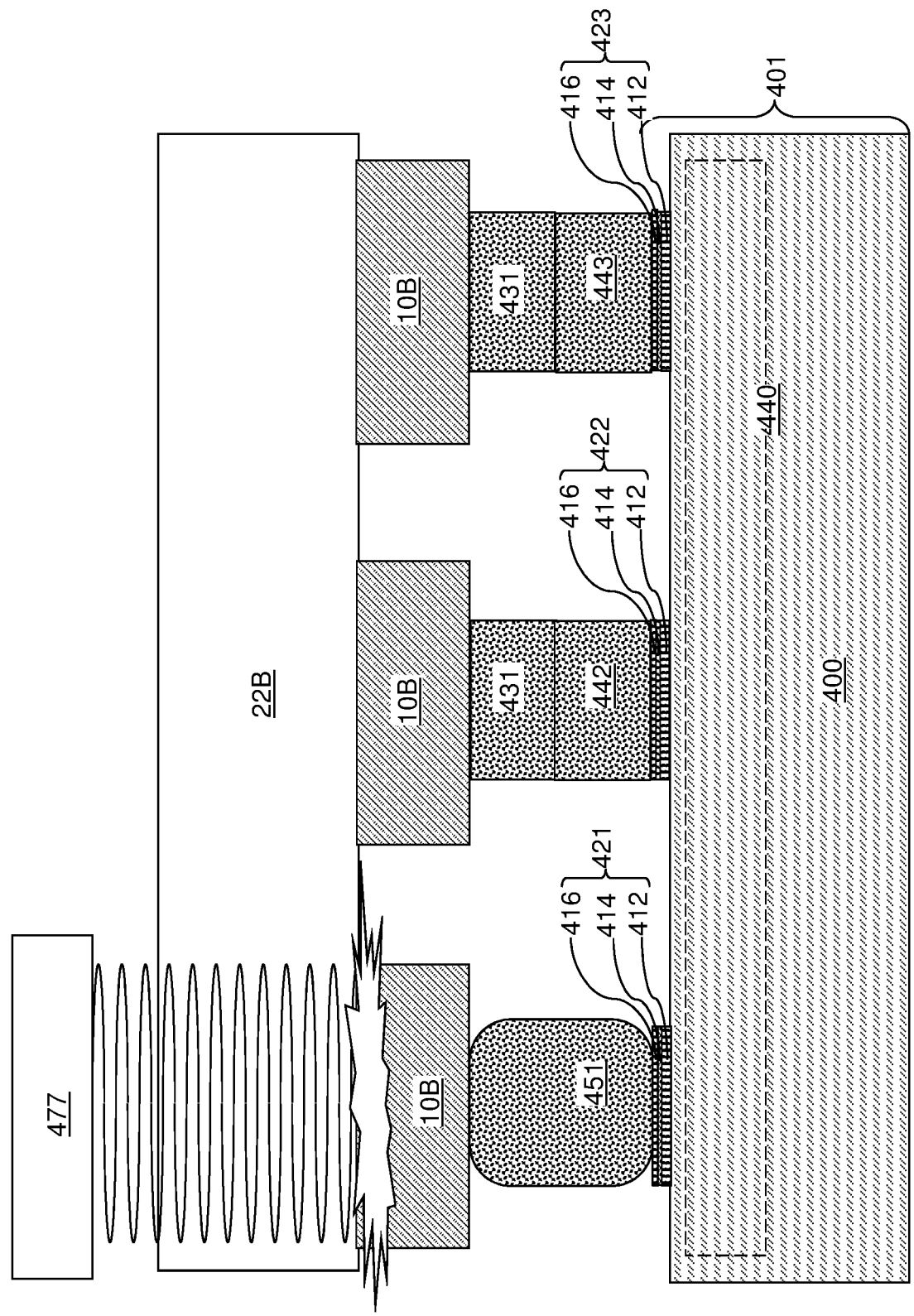

Referring to FIG. 11C, a laser irradiation process is performed to separate each bonded first light emitting diode 10B from the first support substrate 22B. The wavelength of the laser 477 (which is herein referred to an "ablation laser") can be different (e.g., shorter) from the wavelength of the heating laser 467, for example between 0.1 and 0.75 micron, such as 0.25 to 0.5 micron. The single crystalline buffer semiconductor layer 24 absorbs the irradiation within such a wavelength range. Thus, the material of the single crystalline buffer semiconductor layer 24 is ablated upon laser irradiation, and remaining portions of the underlying first light emitting diode 10B is disconnected from the first support substrate 22B. A surface of an n-doped compound semiconductor substrate layer 26 is physically exposed within the remaining portion of each irradiated first light emitting diode 10B. Within each irradiated first light emitting diode 10B, the single crystalline buffer semiconductor layer 24 may be completely removed, or a remaining portion of the single crystalline buffer semiconductor layer 24 may include an opening through which the surface of an underlying n-doped compound semiconductor substrate layer 26 is physically exposed.

Figure 11D:
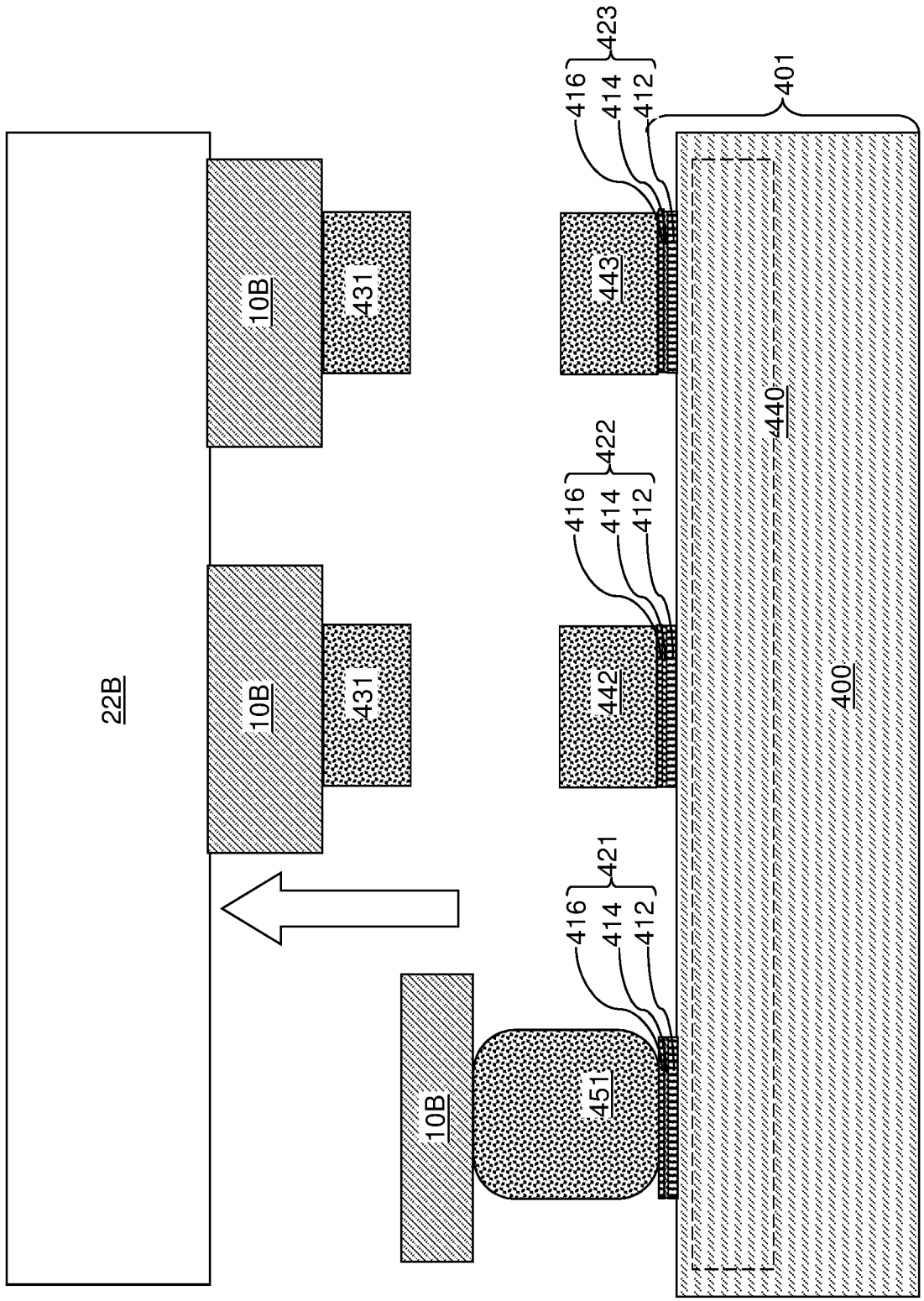

Referring to FIG. 11D, the assembly of the first support substrate 22B and attached first light emitting diodes 10B (i.e., a subset of the first light emitting diodes 10B that are not transferred to the backplane substrate 400) is separated from the backplane 401 and the transferred (bonded) subset of the first light emitting diodes 10B.

Figure 11E:
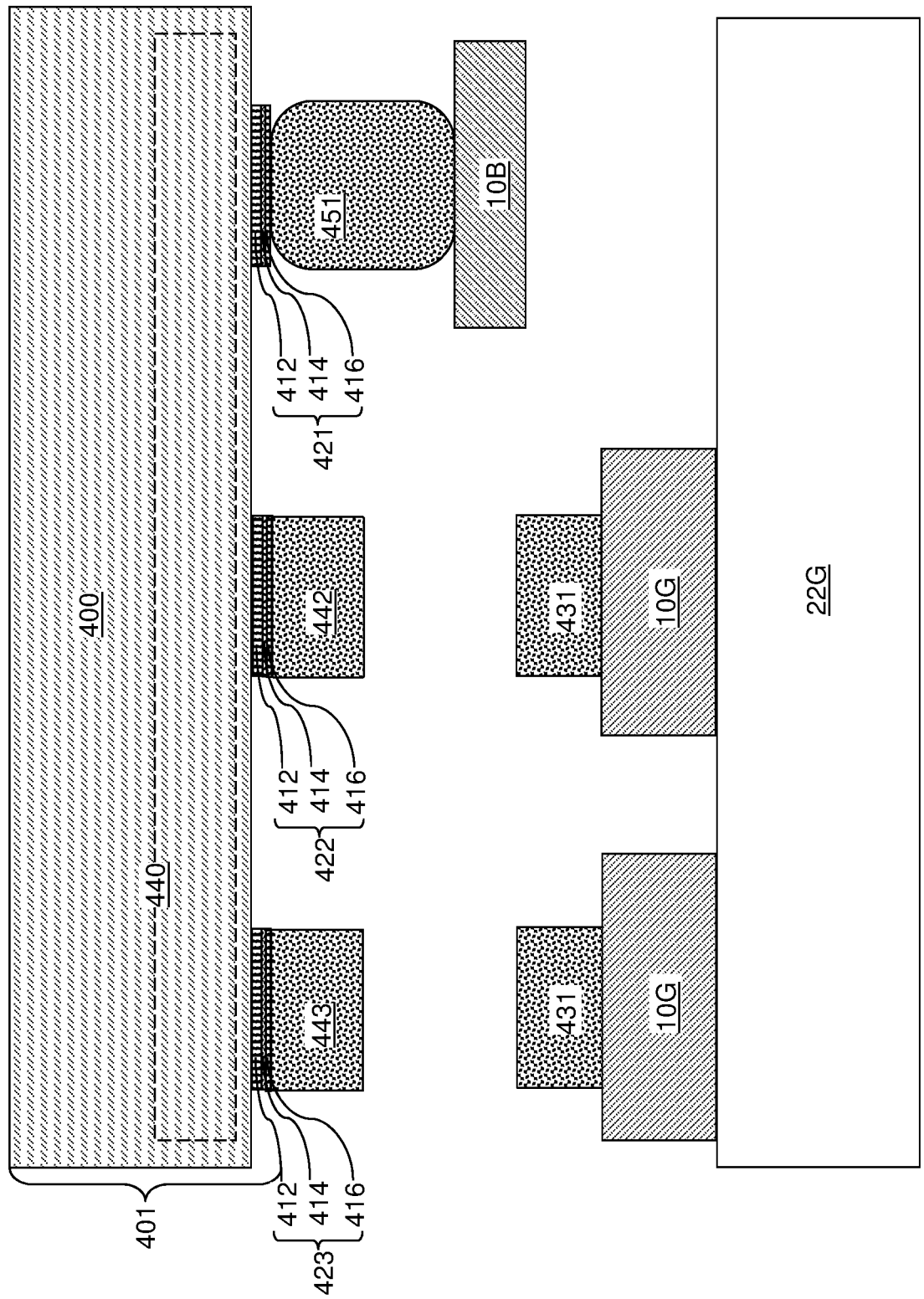

Referring to FIG. 11E, a second support substrate 22G is provided. The second support substrate 22G can be formed with a full array of second light emitting diodes 10G. The processing steps of FIGS. 11A-11D can be performed on another backplane (not shown) to remove a subset of second light emitting diodes 10G such that the pattern of the removed second light emitting diodes 10G include a mirror image of the pattern of the transferred first light emitting diodes 10B on the backplane 401. Thus, when the assembly of the second support substrate 22G and a set of remaining second light emitting diodes 10G is disposed over the assembly of the backplane 401 and the transferred first light emitting diodes 10B, each second light emitting diode 10G can face a respective one of the backplane-side bonding pads (422, 423) without any intervening first light emitting diode 10B. The assembly of the second support substrate 22G and a set of remaining second light emitting diodes 10G is positioned over the in-process exemplary light emitting device assembly including the backplane 401 and the transferred first light emitting diodes 10B, and is aligned such that the second light emitting diodes 10G overlie a respective one of the backplane-side bonding pads (422, 423).

Figure 11F:
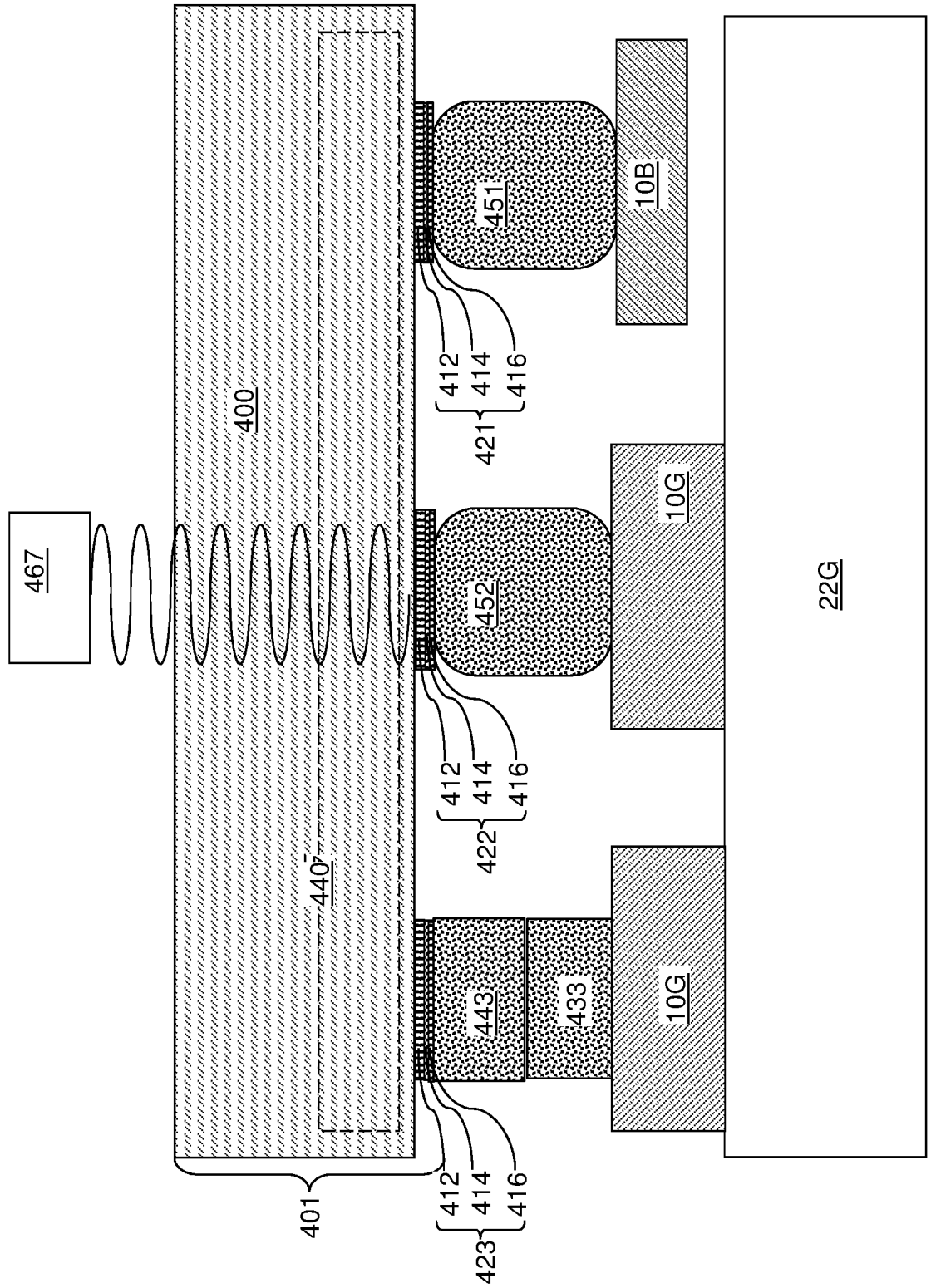

Referring to FIG. 11F, the laser irradiation method of FIG. 11B can be employed to bond a selected subset of the second light emitting diodes 10G to the backplane 401. The backplane 401 and the assembly including the second support substrate 22G and the second light emitting diodes 10G are positioned such that each tin portion 431 faces a respective one of the backplane-side bonding pads (422, 423). In one embodiment, the vertical distance between opposing pairs of a tin portion 431 and a backplane-side tin portion (442, 443) is less than 1 micron, and preferably less than 0.1 micron. A heating laser 467 (which may be the same as, or different from, the heating laser 467 employed at the processing steps of FIG. 11B) can be employed to reflow selected opposing pairs of a tin portion 431 and a backplane-side tin portion 442.

The laser beam may be transmitted through the backplane substrate 401 and irradiate a selected backplane-side bonding pad 422 and an underlying backplane-side tin portion 442. Upon reflow of the backplane-side tin portion 442, an underlying tin portion 431 can be thermally connected and reflow. Depending on the intensity of the laser beam, the backplane-side tin portion 442 and the underlying tin portion 431 may be simultaneously heated by the laser beam. Alternatively, the laser beam may be transmitted through the second support substrate 22G and irradiate the reflector material layer 70 of an irradiated second light emitting diode 10G, which absorbs the laser beam and heats an underlying pair of a tin portion 431 and a backplane-side tin portion 442 for selective heating and reflow. A soldered tin portion 452 may be formed from the reflowed materials of each heated and reflowed pair of a tin portion 431 and a backplane-side tin portion 442. A third metallic bonding pad layer 86 and a third backplane-side bonding pad layer 416 that are bonded to the soldered tin portion 452 provide adhesion of the soldered tin portion 452 to an underlying backplane-side bonding pad 422 and an overlying device-side bonding pad 80 through gradual increase in the platinum concentration for each bonded second light emitting diode 10G.

Figure 11G:
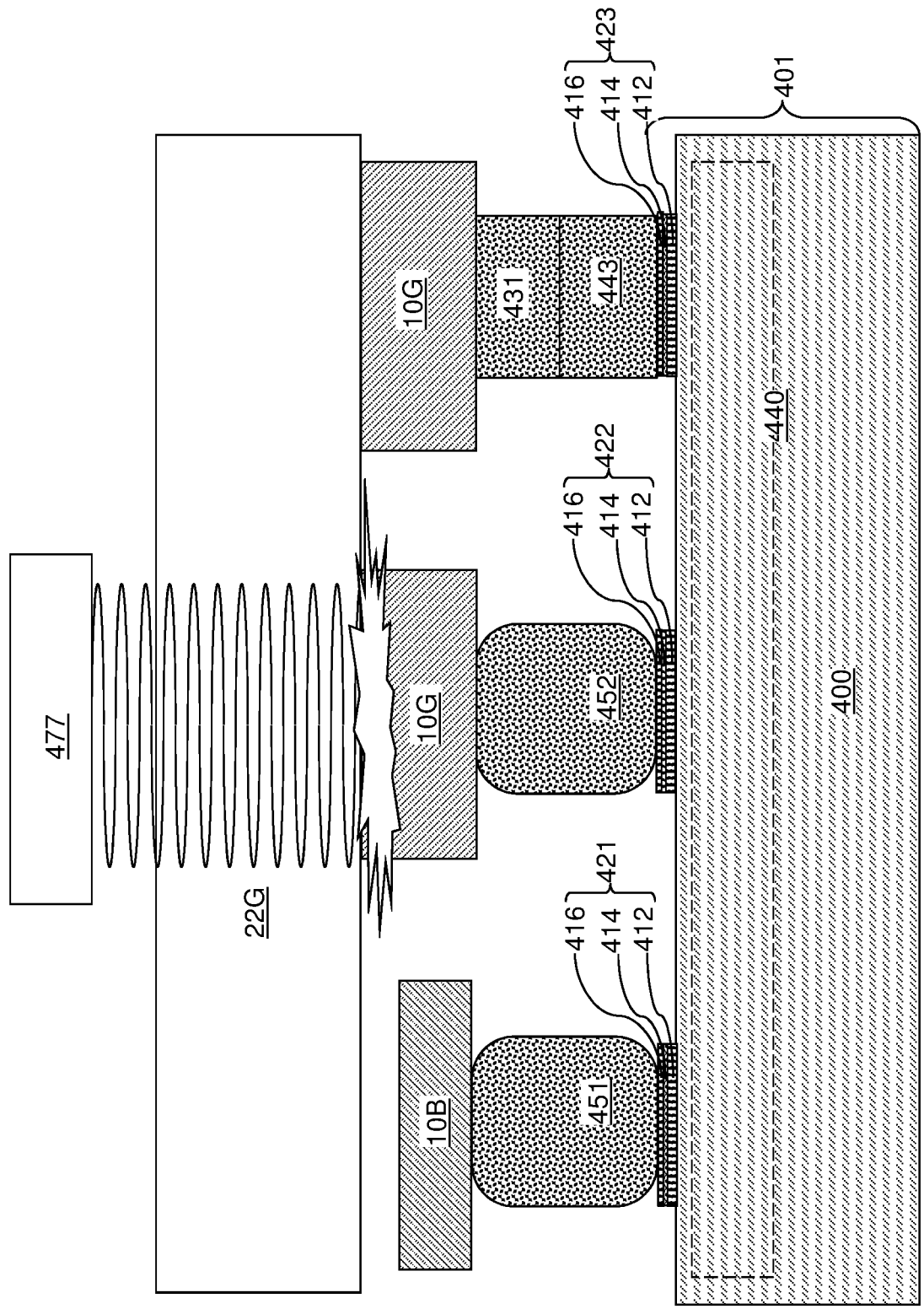

Referring to FIG. 11G, a laser irradiation process from an ablation laser 477 is performed to separate each bonded second light emitting diode 10G from the second support substrate 22G. A surface of an n-doped compound semiconductor substrate layer 26 is physically exposed within the remaining portion of each irradiated second light emitting diode 10G. Within each irradiated second light emitting diode 10G, the single crystalline buffer semiconductor layer 24 may be completely removed, or a remaining portion of the single crystalline buffer semiconductor layer 24 may include an opening through which the surface of an underlying n-doped compound semiconductor substrate layer 26 is physically exposed.

Figure 11H:
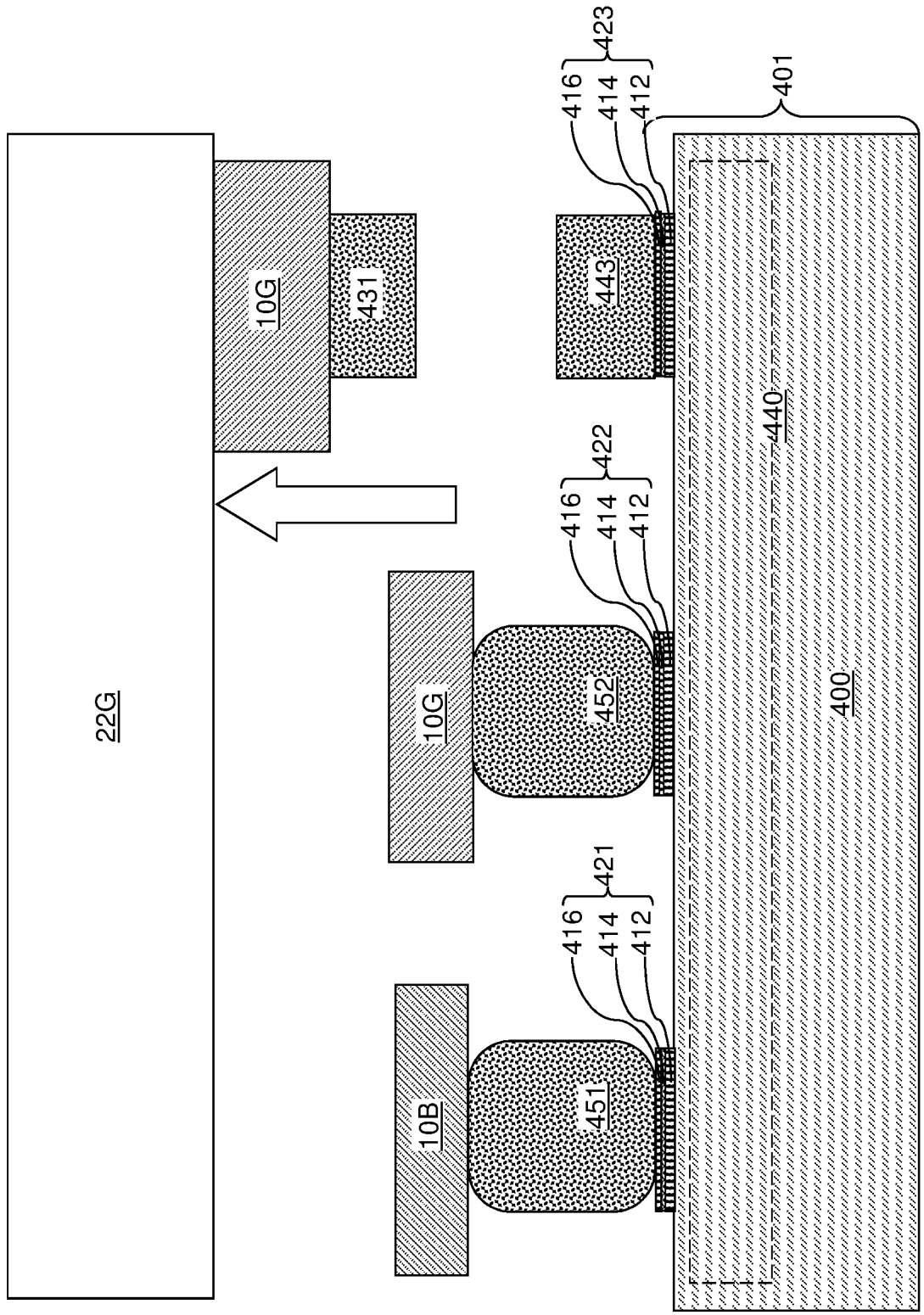

Referring to FIG. 11H, the assembly of the second support substrate 22G and attached second light emitting diodes 10G (i.e., a subset of the second light emitting diodes 10G that are not transferred to the backplane substrate 400) is separated from the backplane 401 and the transferred (bonded) subset of the second light emitting diodes 10G.

Figure 11I:
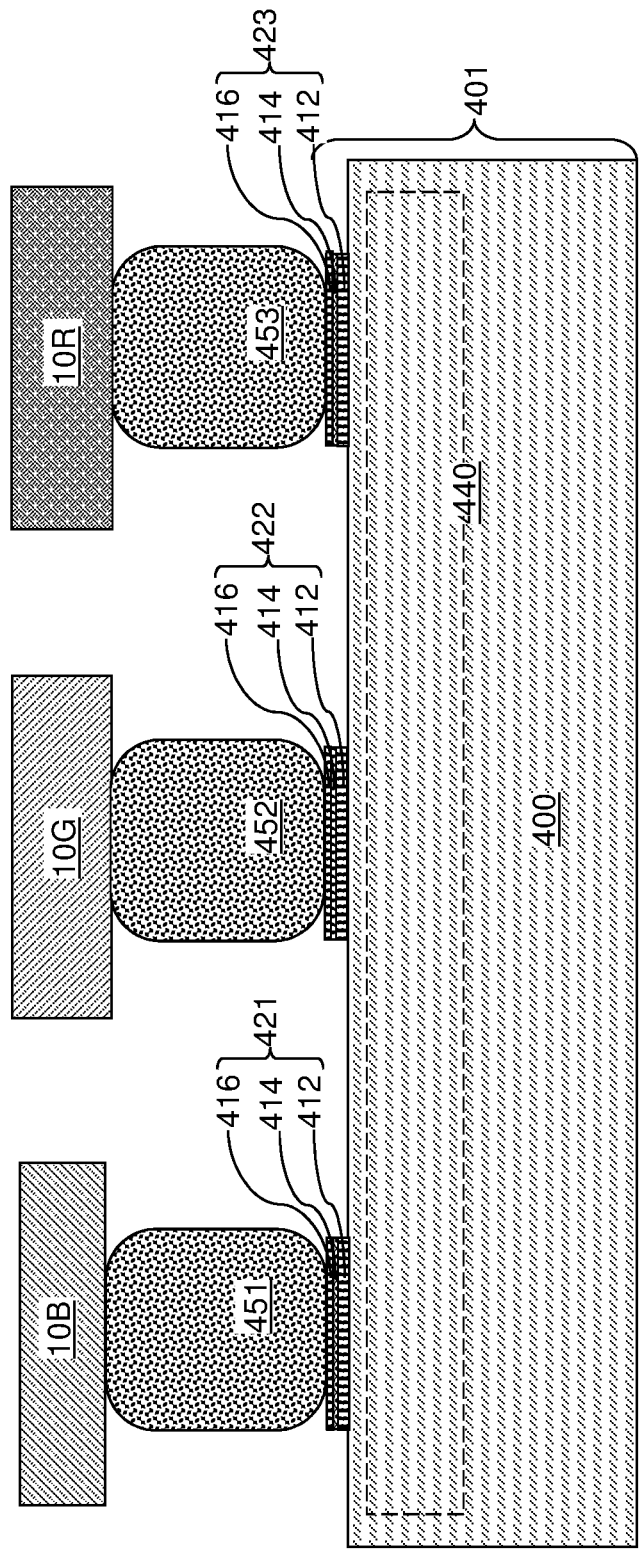

Referring to FIG. 11I, a third support substrate with third light emitting diodes 10R is provided such that vacancies are present among the third light emitting diodes 10R. The pattern of the vacancies include a mirror image of the pattern of the transferred first light emitting diodes 10B and the transferred second light emitting diodes 10R on the backplane 401. Thus, when the assembly of the third support substrate and the third light emitting diodes 10R thereupon is disposed over the assembly of the backplane 401 and the transferred first light emitting diodes 10B and the transferred second light emitting diodes 10G, each third light emitting diode 10R can face a respective one of the backplane-side bonding pads 423 without any intervening first light emitting diode 10B or any intervening third light emitting diode 10R. The processing steps of FIGS. 11E-11H can be repeated to transfer a selected subset of the third light emitting diodes 10R to the backplane 401. A third metallic bonding pad layer 86 and a third backplane-side bonding pad layer 416 that are bonded to the soldered tin portion 453 provide adhesion of the soldered tin portion 453 to an underlying backplane-side bonding pad 423 and an overlying device-side bonding pad 80 through gradual increase in the platinum concentration for each bonded third light emitting diode 10R.

Figure 11J:
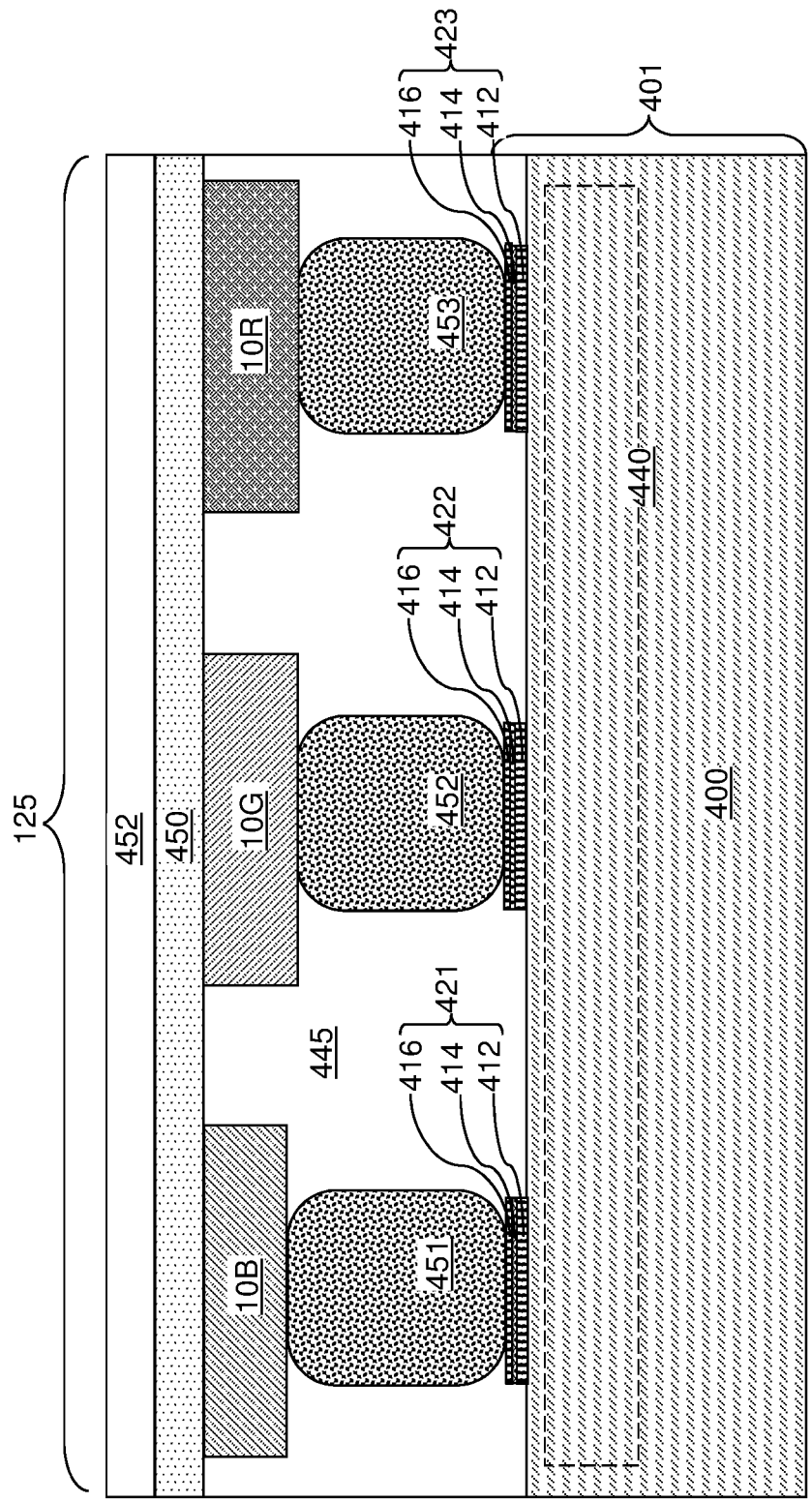

Referring to FIG. 11J, a dielectric matrix 445 can be formed in the spaces among the transferred light emitting diodes (10B, 10G, 10R) that are bonded to the backplane 401. The dielectric matrix 445 can laterally surround each of the light emitting diodes (10B, 10G, 10R) that constitute the array of pixels over the backplane 401. The dielectric matrix 445 can include a self-planarizing dielectric material such as spin-on glass (SOG) or polymer, or can be planarized by a recess etch or chemical mechanical planarization. The top surface of the dielectric matrix 445 as planarized can be within the horizontal plane including the top surfaces of the transferred light emitting diodes (10B, 10G, 10R), or can be vertically recessed below the horizontal plane including the top surfaces of the transferred light emitting diodes (10B, 10G, 10R). In one embodiment, the dielectric matrix 445 may be patterned to physically expose a conductive pad structure on the backplane substrate 400.

A front side transparent conductive oxide layer 450 can be formed over the dielectric matrix 445 and directly on the electrical nodes that are located on top of each transferred light emitting diode (10B, 10G, 10R). For example, the front side transparent conductive oxide layer 450 can be deposited on the compound semiconductor material layer 26 of each transferred light emitting diode (10B, 10G, 10R) and the physically exposed conductive pad structure (not shown) located on the backplane substrate 400, thereby providing a common electrical ground for the transferred light emitting diodes (10B, 10G, 10R). Alternatively, if the single crystalline buffer semiconductor layer 24 has a high resistivity and is not completely removed during the laser ablation step described above, additional n-type dopants can be introduced into the single crystalline buffer semiconductor layer 24 to provide sufficiently high conductivity, and the n-doped single crystalline buffer semiconductor layer 24 can be employed as a conductive path to the front side transparent conductive oxide layer 450.

An optional transparent passivation dielectric layer 452 can be formed over the front side transparent conductive oxide layer 450. The transparent passivation dielectric layer 452 can include silicon nitride or silicon oxide. Thus, the transferred light emitting diode (10B, 10G, 10R) can emit light through the n-doped compound semiconductor substrate layer 26, the front side transparent conductive oxide layer 450 and the transparent passivation dielectric layer 452. The light emitting diodes are vertical devices because they have electrical contacts on opposite sides, i.e., one electrical contact at top and another electrical contact at bottom.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

The invention claimed is:

1. A method of forming a light emitting diode (LED), comprising:
    forming n-doped semiconductor material layer;
    forming an active region including an optically active compound semiconductor layer stack configured to emit light on the n-doped semiconductor material layer;
    forming a p-doped semiconductor material layer on the active region;
    deactivating a physically exposed portion of the p-doped semiconductor material layer with a plasma treatment to form an inactive region while an electrically active region remains in the p-doped semiconductor material that is not subjected to the plasma during the plasma treatment;
    forming an anode contact on the p-doped semiconductor material layer;
    forming a reflector overlying and electrically connected to the anode contact; and
    forming a device-side bonding pad layer on the reflector, wherein an area of an interface between the electrically active region and the anode contact is equal to an area which during LED operation produces a current density in a range from 0.90 times a peak external quantum efficiency of the LED to the peak external quantum efficiency of the LED.

2. A method of forming a light emitting diode (LED), comprising:
    forming n-doped semiconductor material layer;
    forming an active region including an optically active compound semiconductor layer stack configured to emit light on the n-doped semiconductor material layer;
    forming a p-doped semiconductor material layer on the active region;
    deactivating a physically exposed portion of the p-doped semiconductor material layer with a plasma treatment to form an inactive region while an electrically active region remains in the p-doped semiconductor material that is not subjected to the plasma during the plasma treatment;
    forming an anode contact on the p-doped semiconductor material layer;
    forming a reflector overlying and electrically connected to the anode contact; and
    forming a device-side bonding pad layer on the reflector, wherein an electrical conductivity of the inactive region is less than 30% of the electrical conductivity of the electrically active region.

3. A method of forming a light emitting diode (LED), comprising:
    forming n-doped semiconductor material layer;
    forming an active region including an optically active compound semiconductor layer stack configured to emit light on the n-doped semiconductor material layer;
    forming a p-doped semiconductor material layer on the active region;
    deactivating a physically exposed portion of the p-doped semiconductor material layer with a plasma treatment to form an inactive region while an electrically active region remains in the p-doped semiconductor material that is not subjected to the plasma during the plasma treatment;
    forming an anode contact on the p-doped semiconductor material layer;
    forming a reflector overlying and electrically connected to the anode contact; and
    forming a device-side bonding pad layer on the reflector, wherein the inactive region has a crystalline defect density that is at least ten times a crystalline defect density of the electrically active region.

4. A method of forming a light emitting diode (LED), comprising:
    forming n-doped semiconductor material layer;
    forming an active region including an optically active compound semiconductor layer stack configured to emit light on the n-doped semiconductor material layer;
    forming a p-doped semiconductor material layer on the active region;
    deactivating a physically exposed portion of the p-doped semiconductor material layer with a plasma treatment to form an inactive region while an electrically active region remains in the p-doped semiconductor material that is not subjected to the plasma during the plasma treatment;
    forming an anode contact on the p-doped semiconductor material layer;
    forming a reflector overlying and electrically connected to the anode contact; and
    forming a device-side bonding pad layer on the reflector, wherein deactivating the physically exposed portion of the p-doped semiconductor material layer with the plasma treatment occurs after forming the anode contact, such that the inactive region is exposed by the anode contact while the electrically active region is covered by the anode contact and is not subjected to the plasma during the plasma treatment.

\* \* \* \* \*